United States Patent
Gal et al.

(10) Patent No.: US 9,628,119 B2
(45) Date of Patent: *Apr. 18, 2017

(54) ADAPTIVE HIGH-ORDER NONLINEAR FUNCTION APPROXIMATION USING TIME-DOMAIN VOLTERRA SERIES TO PROVIDE FLEXIBLE HIGH PERFORMANCE DIGITAL PRE-DISTORTION

(71) Applicant: Freescale Semiconductor, Inc., Austin, TX (US)

(72) Inventors: Avraham Dov Gal, Ra'anana (IL); Peter Zahariev Rashev, Calgary (CA); Roi Menahem Shor, Tel-Aviv (IL)

(73) Assignee: NXP USA, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/752,574

(22) Filed: Jun. 26, 2015

(65) Prior Publication Data

US 2015/0381220 A1    Dec. 31, 2015

Related U.S. Application Data

(63) Continuation-in-part of application No. 14/318,000, filed on Jun. 27, 2014.

(51) Int. Cl.
*H04K 1/02*    (2006.01)
*H04L 25/03*    (2006.01)
(Continued)

(52) U.S. Cl.
CPC ... *H04B 1/0475* (2013.01); *H04B 2001/0425* (2013.01)

(58) Field of Classification Search
CPC ........ H03F 1/3247; H03F 3/24; H03F 1/3241; H04L 27/368; H03G 3/3042
(Continued)

(56) References Cited

U.S. PATENT DOCUMENTS 7,007,253 B2 *    2/2006    Gullapalli ........... G06F 17/5036
                                                716/115
7,158,578 B2 *    1/2007    Khlat ................ H04L 25/03834
                                                375/235

(Continued)

OTHER PUBLICATIONS

A. Zhu et al, An adaptive Volterra Predistorter for the Linearization of RF High Power Amplifiers, 2002 IEEE MTT-s Digest.

(Continued)

*Primary Examiner* — James M Perez

(57) ABSTRACT

A method is described for predistorting an input signal to compensate for non-linearities caused to the input signal in producing an output signal. The method comprises: providing an input for receiving a first input signal as a plurality of signal samples, x[n], to be transmitted over a non-linear element; providing at least one digital predistortion block comprising, a plurality of IQ predistorter cells coupled to the input, each comprising a lookup table (LUT) for generating an LUT output. The at least one digital predistortion block block is configured to apply interpolation between LUT entries for the plurality of LUTs; and generate an output signal, y[n], by each of the plurality of IQ predistorter cells by adaptively modifying the first input signal using interpolated LUT entries to compensate for distortion effects in the non-linear element. A combiner may be provided configured to combine the output signal samples, $y_Q$, from the plurality of IQ predistorter cells into a combined signal to generate the output signal, y[n], for transmission to the non-linear element. An error calculation block may be coupled to a digital predistortion adaptation block to determine and modify a predistortion performance.

19 Claims, 12 Drawing Sheets

(51) Int. Cl.
*H04L 25/49* (2006.01)
*H04B 1/04* (2006.01)

(58) Field of Classification Search
USPC .................................................. 375/295–297
See application file for complete search history.

(56) References Cited

U.S. PATENT DOCUMENTS

| | | | |
|---|---|---|---|
| 7,796,960 B1 | 9/2010 | Rashev et al. | |
| 8,564,368 B1 | 10/2013 | Bai | |
| 9,088,472 B1* | 7/2015 | Jain | H04L 27/368 |
| 9,100,253 B2* | 8/2015 | Mundarath | H04L 27/2624 |
| 9,130,628 B1* | 9/2015 | Mittal | H04B 1/0475 |
| 9,231,530 B1* | 1/2016 | Kaushik | H04B 1/0475 |
| 9,252,821 B2* | 2/2016 | Shor | H04B 1/0475 |
| 2005/0253745 A1 | 11/2005 | Song et al. | |
| 2008/0130789 A1* | 6/2008 | Copeland | H03F 1/3247 |
| | | | 375/297 |
| 2008/0243899 A1 | 10/2008 | Staudinger et al. | |
| 2010/0091830 A1* | 4/2010 | Li | H04B 3/142 |
| | | | 375/231 |
| 2012/0098596 A1* | 4/2012 | Nagatani | H03F 1/3247 |
| | | | 330/149 |
| 2012/0119810 A1* | 5/2012 | Bai | H03F 1/3252 |
| | | | 327/317 |
| 2012/0147993 A1 | 6/2012 | Kim et al. | |
| 2012/0229206 A1 | 9/2012 | van Zelm et al. | |
| 2013/0285742 A1 | 10/2013 | van Zelm et al. | |
| 2014/0009224 A1 | 1/2014 | van Zelm et al. | |
| 2014/0044215 A1* | 2/2014 | Mundarath | H04L 27/2624 |
| | | | 375/297 |
| 2014/0086361 A1* | 3/2014 | Azadet | H04L 1/0054 |
| | | | 375/297 |
| 2014/0317163 A1* | 10/2014 | Azadet | G06F 17/5009 |
| | | | 708/420 |
| 2015/0381216 A1* | 12/2015 | Shor | H04B 1/0475 |
| | | | 375/297 |
| 2016/0054995 A1* | 2/2016 | Dehner | G06F 9/3001 |
| | | | 712/222 |
| 2016/0179715 A1* | 6/2016 | Kaushik | G06F 13/28 |
| | | | 710/308 |

OTHER PUBLICATIONS

H. Gandhi, A Flexible Volterra-Based Adaptive Digital Pre-Distortion Solution for Wideband RF Power Amplifier Linearization, Microwaves & RF Magazine, 2008.

P. L. Gilabert et al., Multi-Lookup Table FPGA Implementation of an Adaptive Digital Predistorter for Linearizing RF Power Amplifiers with Memory Effects, IEEE Transactions on Microwave Theory and Techniques, vol. 56, No. 2, Feb. 2008.

Seydou N. B. et al., Efficient Lookup Table-Based Adaptive Baseband Predistortion Architecture for Memoryless Nonlinearity. EURASIP Journal on Advances in Signal Processing, 2010.

Freescale Semiconductor, Inc., Fact Sheet: AFD4400, Integrated Solution for Digital Front End Processor Applications; document No. AFD4400FS, Rev 0; May 2015, 2 pages; <<http://cache.nxp.com/files/rf_if/doc/fact_sheet/AFD4400FS.pdf>>.

* cited by examiner

US 9,628,119 B2

ADAPTIVE HIGH-ORDER NONLINEAR FUNCTION APPROXIMATION USING TIME-DOMAIN VOLTERRA SERIES TO PROVIDE FLEXIBLE HIGH PERFORMANCE DIGITAL PRE-DISTORTION

FIELD OF THE INVENTION

The present invention is directed in general to field of information processing. In one aspect, the present invention relates generally to digital predistortion for compensating an input signal for distortion introduced to the input signal by an electronic device.

BACKGROUND OF THE INVENTION

Wireless communication devices, such as mobile devices and base stations, typically include transmitter and receiver circuits (i.e., transceivers) in which power amplifiers are used to amplify a signal before wireless transmission to another device. However, some radio frequency (RF) power amplifiers generate out-of-band spurious emissions or otherwise add non-linear distortion to the amplified signal, where the distortion may include, for example, variations in phase differences or variations in amplitude differences. Significant distortion may result in poor signal quality.

Traditional approaches for meeting the out-of-band spurious transmission requirements would operate the power amplifier well below its maximum output power, or require very expensive and inefficient power amplifiers which are designed according to the maximum peak power that they have to handle. In order to reduce the cost and improve efficiency of the power amplifier, digital pre-distortion (DPD) systems have been developed to compensate for the intrinsic distortion characteristics of non-linear power amplifier devices. A traditional DPD system determines an error signal which reflects differences between an input signal and a feedback signal from the system output, and then, uses the error signal to determine a complementary distortion or inverse gain signal which is combined with the input signal to produce a pre-distorted signal that is input to, the power amplifier device. In many cases, this process results in effective cancellation of the distortion (i.e., the non-linearities) produced within the system, and a more linear output signal may result.

One approach for performing digital pre-distortion uses a polynomial model of the power amplifier that is evaluated to generate a pre-distortion function that is applied at the amplifier input to obtain a linear gain output. Other pre-distortion processes use one or more polynomials to adjust the input signal prior to amplification in order linearize the amplifier gain. In any case, the real-time processing requirements for evaluating a polynomial can impose significant complexity and processing costs in terms of the significant digital processing resources required to evaluate the polynomial.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
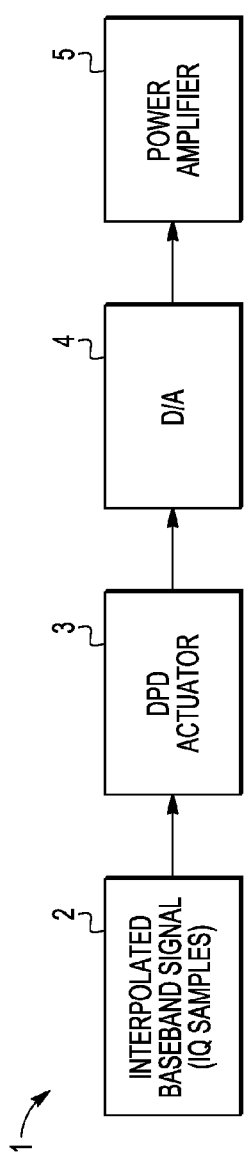
FIG. 1 is a simplified block diagram of a digital baseband predistortion communication system within a transmitter.

A system, apparatus, and methodology are described for evaluating a polynomial with a flexible high performance digital predistortion hardware which performs pre-correction processing on received baseband signal samples to overcome power amplifier non-linear operation (a.k.a. distortion).

In selected embodiments, a single chip digital front end processor in an electronic device, such as a base station, performs digital pre-distortion on a composite multi-carrier waveform. The electronic device uses integrated predistorter hardware cells, with each cell comprising a lookup table (LUT) for generating an LUT output. Interpolation is applied between LUT entries for the plurality of LUTs and an output signal $\underline{y}[n]$ generated by each of a plurality of predistorter cells by adaptively modifying an input signal using the interpolated LUT entries. Modifying the input signal using the interpolated LUT entries provides improved compensation for distortion effects in one or more non-linear elements in the electronic device.

In selected embodiments, at least one error generation path and an error calculation block comprising an error calculation block may be coupled to a digital predistortion adaptation block to determine and modify a predistortion performance of the at least one digital predistortion block. In selected embodiments, the digital predistortion adaptation block provides values to a plurality of LUT entries per predistorter hardware cell using a plurality of lines L of extrapolation from the error calculation block.

In selected embodiments, modifying the first input signal is modified using interpolated LUT entries to compensate for distortion effects in the non-linear element by applying a different decay μ factor per digital predistortion block. The provision of a different adaptation rate per BPC in such a manner provides better stability, as well as enabling a tradeoff between faster adaptation and better stability.

In selected embodiments, a receive filter is included in the error calculation path to select a passband to be used for DPD adaptation and overcome any distortion associated with a feedback receive path. In selected embodiments, a transmit filter is included in the error calculation path to select a passband to be used for DPD adaptation. The inclusion of transmit or receive filters in the error path provides stability and performance improvement via the manipulation of DPD adaptation passband(s).

In selected embodiments, a single chip digital front end processor at a base station performs digital pre-distortion on a composite multi-carrier waveform using integrated predistorter hardware cells to evaluate Volterra series memory polynomial terms and higher order cross terms (e.g., type 1, 2 and 3) to model the inverse operation of power amplifiers (PA). For example, a scalable vector signal processor (VSP) may be optimized to perform digital pre-distortion (DPD) by including a plurality of predistorter cells to evaluate a complex polynomial $\underline{y}[n]$ of order P against a complex input vector (e.g., $\underline{x}[n]=(x_0, x_1, \ldots, x_n)$) using Volterra's method.

Each predistorter cell receives absolute sample values (A[n]) from a first delay line that holds the last K absolute values of the input complex samples ($\underline{x}[n]$) and also receives complex sample values from a second delay line that holds the last K input complex samples ($\underline{x}[n]$). In addition, each of Q identical predistorter cells includes an N-line look-up table (LUT) which performs linear interpolation between LUT values to decrease quantization error. Using the product of one or more absolute sample values to index into the LUT, the resulting LUT outputs provide product terms (e.g., β*A[n−k]) which are multiplied with additional absolute sample values (e.g., A[n−l]) or complex sample values (e.g., x[n−k]) using a combination of multiplier and multiplexer hardware circuits so that the output of each cell may be combined at an adder circuit to generate the sum. For example, a pair of input multiplexers is used to multiply first and second absolute sample values at a first stage multiplier circuit, with the product being multiplexed at a first stage multiplexer along with an absolute sample value from one of the input multiplexers.

The selected output from the first stage multiplexer is supplied as an index to the LUT with linear interpolation, and the resulting LUT output may be multiplied with another absolute sample value at a second stage multiplier. At a third stage multiplier, the selected output from the second stage multiplexer is multiplied with a complex sample value, and the resulting product is then multiplexed at an output multiplexer along with a "0" value to provide a first output term. With the "0" input selected, the basic predistorter hardware cell (BPC) is disabled to save power. In this way, different output terms from different predistorter cells may be combined or added at a shared adder circuit.

In addition, multiple BPCs can be cascaded in various ways to produce higher order Volterra terms of different cross-term structure. By computing power series terms using look-up tables, a high throughput, flexible and power efficient digital predistorter hardware implementation is provided which has a smaller device area, lower power consumption, and minimal or zero impact on DPD linearization performance. In selected embodiments, a single chip digital front end processor at a base station performs digital pre-distortion on a composite multi-carrier waveform by using integrated predistorter hardware cells to perform Volterra's processing algorithm to calculate polynomial values from a complex input vector. However, it will, be appreciated that the digital predistortion functionality provided is not constrained to a specific mathematical model, such as Volterra, since the LUT can represent any form of function not only a power series model.

Applicants have determined that a need exists for improved digital pre-distortion (DPD) processing operations in wireless communication systems (such as 3G, 4G and future generations of systems) on the transmit side to overcome the problems in the art, such as outlined above, though further limitations and disadvantages of conventional technologies will become apparent to one of skill in the art after reviewing the remainder of the present application.

For example, FIG. 1 is a simplified block diagram of a digital baseband predistortion communication transmitter 1 which processes received interpolated samples at a digital predistortion actuator 3 for RF conversion at the digital-to-analog converter and power amplification at RF power amplifier (PA) 5 for transmission by a corresponding antenna (not shown). While there are DPD actuator solutions which use algorithms based on Volterra modeling of the inverse operation of power amplifier, such solutions are typically quite complex, and utilize software-based actuators or hardware-based actuators which provide only limited support for computing memory polynomial terms and basic cross terms from the Volterra series approximation of non-linear functions while requiring a significant amount of computational resources.

In this disclosure, Applicants have provided an improved system, apparatus, and method for evaluating a polynomial against a one or more complex input vectors to allow flexible support for advanced DPD actuators by cascading DPD actuator hardware cells to support computation of Volterra series memory polynomial terms and cross terms of type 1, 2 and 3 based on look-up table (LUT) implementation in single memory to address various problems in the art where various limitations and disadvantages of conventional solutions and technologies will become apparent to one of skill in the art after reviewing the remainder of the present application with reference to the drawings and detailed description which follow.

Some of these advantages include scalability of performance, improved versatility, or simplified implementation. Scalability is enabled by the way that each SoC can decide the number of required BPCs based on performance requirements. Versatility is provided while fully re-using a re-configured version of the existing hardware by re-arranging the interconnections among the BPCs. A common, small, and efficient BPC building block can not only be readily re-used, but also the advantage of simpler verification/validation, and overall effort of implementation.

Furthermore, and given a certain LUT-size and a number of LUTs, current direct adaptation algorithms require a long adaptation time in order to achieve a required performance. Hence, there is a desire to reduce adaptation time.

In some examples, a more efficient direct adaptation of a DPD system employing multiple basic predistorter hardware cells (multi-BPCs), each in turn having at least one LUT is described. In some multi-BPC examples, a DPD actuator with interpolation is introduced, where DPD adaptation uses L-lines of data extrapolation. In some examples, a specific decay $\mu$ factor per digital predistortion block or per LUT may be employed. In some examples, an error calculation block is introduced that calculates a predistortion error based on the selected samples in the delay line. In this manner, one or more of the above concepts may assist a reduction in the cost of complex hardy, are required DPD architectures.

Figure 2:
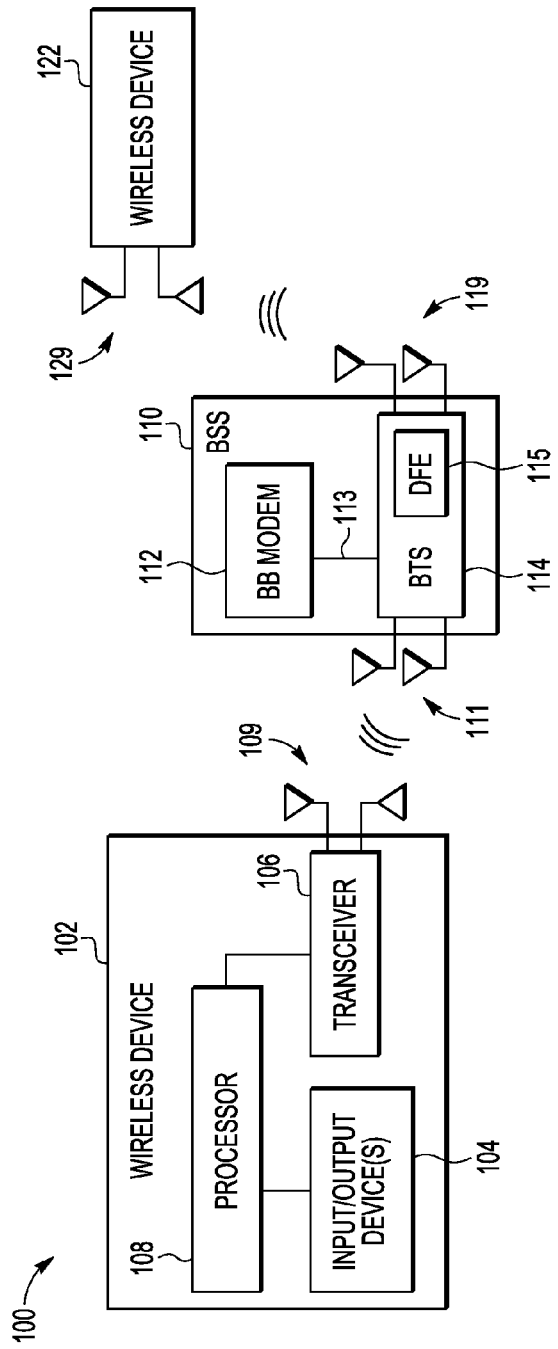
FIG. 2 is a simplified block diagram of a wireless communication system with a base station system deployed with a plurality of radio base station subsystems in accordance with selected embodiments of the present disclosure.

Turning now to FIG. 2, there is shown a simplified block diagram of a wireless communication system 100 having digital front end (DFE) modules at one of more multi-antenna system nodes for performing digital pre-distortion on transmit signals prior to power amplification. The depicted wireless communication system 100 includes a plurality of wireless devices or subscriber stations 102, 122 (e.g., hand-held computers, personal digital assistants (PDAs), cellular telephones, etc.) that wirelessly communicate with one or more base station systems (BSS) 110 (e.g., enhanced Node-B or eNB devices). Each wireless devices (e.g., 102) may, include a processor 108 (e.g., a digital signal processor), a transceiver 106 connected to one or more antennas 109, and one or more input/output devices 104 (e.g., a camera, a keypad, display, etc.), along with other components (not shown). The wireless devices 102, 122 use attached antennas 109, 129 to wirelessly communicate with the base station system (BSS) 110 via antennas 111, 119 to receive or transmit voice, data, or both voice and data.

In the depicted arrangement, the base station system 110 is deployed with a plurality of radio base station subsystems or nodes, including a baseband modem 112 (e.g., radio equipment control device) and at least one base transceiver station (BTS) 114 connected to one or more antennas 111, 119 to function as a radio equipment device. In the illustrated topology, the baseband modem 112 is connected over a network link 113 (e.g., CPRI link) to a first BTS 114.

In the embodiments shown, the base transceiver station 114 includes a digital front end (DFE) processor 115 which may be implemented as a single integrated circuit to provide the digital components of the cellular base, station RF subsystem. The digital components consolidated on each DFE 115 may include one or more control processors and digital transmit/receive filters, as well as interface peripherals and other I/O for RF subsystem functions. In addition and as described more fully below, each DFE 115 may include a transmit processing path for each antenna which performs signal processing on the transmit signal, including digital pre-distortion processing. The DPD-processed transmit signal is then provided to a power amplifier and associated antenna, thereby forming a separate DFE-power amplifier chain for each transmit antenna.

As will be appreciated, the DPD processing techniques disclosed herein with reference to the base station system 110 may also be used in connection with a multi-antenna wireless communication device, such, as the wireless devices 102, 122. To this end, each wireless device 102, 122 may also include a digital front end (DFE) processor or equivalent circuitry connected to a corresponding transceiver unit which includes a transmit processing path for each antenna which performs signal processing on the transmit signal.

Figure 3:
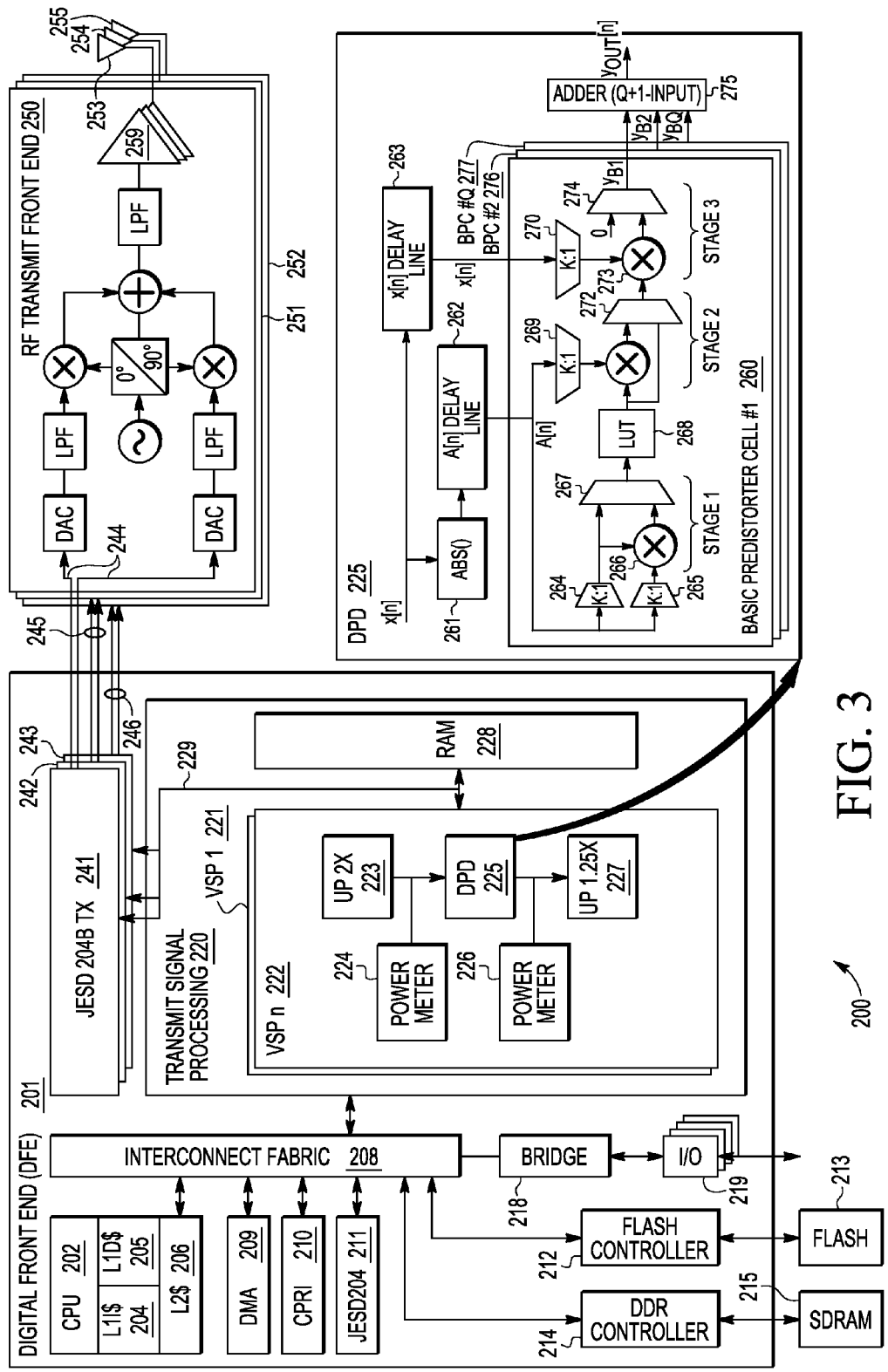
FIG. 3 is a block diagram illustration of a base station system having a multi-antenna radio frequency (RF) sub-system with a single chip digital front end (DFE) processor having integrated digital predistorter hardware cells to evaluate higher order Volterra terms in accordance with selected embodiments of the present disclosure.

To illustrate selected digital pre-distortion processing applications of the integrated digital predistortion hardware disclosed herein, reference is now made to FIG. 3 which depicts a high level architecture block diagram illustration of a multi-antenna radio frequency (RF) base station subsystem 200 which performs pre-distortion using a plurality of LUT-based basic predistortion hardware cells to efficiently evaluate Volterra series memory polynomial terms and higher order cross terms (e.g., type 1, 2 and 3) from the same input vector. The RF base station subsystem 200 is connected to a base station controller (not shown), and includes a single chip digital front end (DFE) processor 201 connected over one or more RF transmit front end circuits 250-252 to one or more antennas 253-255, respectively.

As will be appreciated, a radio receiver front end may be understood to refer to all circuitry between the antenna and the first intermediate frequency (IF) stage, including analog and digital receiver components that process the signal at the original incoming radio frequency (RF) before it is converted to an intermediate frequency (IF). In this arrangement, the digital front end (DFE) processor 201 may be located in a radio head that is co-located with the base station controller, or may be located at a remote radio head that is not co-located with the base station controller. For simplicity of illustration, the transmit antennas 253-255 are shown as being connected to the respective transmit front end circuits 250-252, but it will be appreciated that the transmit antennas 253-255 may be shared for both signal transmission and reception in a shared or switched circuit arrangement.

Connected to each transmit antenna (e.g., 253) is an RF transmit front end circuit (e.g. 250) which includes RF conversion circuit components (e.g., digital-to-analog converters, low pass filters, oscillators, splitters, mixers, amplifiers, etc.) for converting and filtering the digital I and Q samples 244 output by the DFE processor 201 to a combined analog signal that is filtered and amplified (e.g., with one or more RF power amplifiers 259) for transmission by a corresponding antenna (e.g., 253). In similar fashion, each receive antenna may be connected to an RF receive front end circuit (not shown) which includes RF conversion circuit components (e.g., bandpass filters, splitters, low pass filters, oscillators, mixers, amplifiers, analog-to-digital converters, etc.) that process the signal from the antenna received at the original incoming radio frequency (RF) and convert, it for processing by the DFE processor 201. Though the RF front end circuits (e.g., 250) employ the depicted RF conversion and power amplifier circuit components, it will be appreciated that other RF conversion circuit arrangements and power amplifier components can be used.

The digital front end (DFE) processor 201 is provided to perform digital signal processing for the RF base station subsystem 200 across the separate transmit antennas 253-255. To this end, the DFE processor 201 partitions transmit signals to the antennas into transmit processing paths, and communicates with the baseband, modem through, the Common Public Radio Interface (CPRI) interface 210, JESD204A/B interface 211, or other protocol. The DFE processor 201 may include one or more control processors 202 (e.g., one Or more processor cores), memory subsystems (e.g., L1 instruction cache 204, L1 data cache 205, L2 cache 206), memory controllers (e.g., DMA controller 209, flash controller 212, and DDR controller 214) for interfacing with external memory (e.g., Flash memory 213, SDRAM 215), one or more modem interfaces (e.g., CPRI interface 210 and JESD204A/B interface 211), and I1O facilities (e.g., host bridge 218) for I/O devices 219.

As a general matter, any of a variety of memory designs and hierarchies may be employed in, or in conjunction with, with the DFE processor 201. Also, it will be appreciated that the I/O devices 219 may include any desired I/O device, such as Ethernet. I2C, SPI, GPIO, or DART devices. All processor subsystems are linked by a multi-level interconnect fabric 208.

To digitally process transmit signals, the DFE processor 201 may also include a programmable transmit signal processing path for each transmit antenna 253-255 which is formed with a transmit signal processor 220 and an associated serialized interface 241-243 (e.g., a JESD204B TX interface) and RF transmit front end 250-252. The transmit signal processor 220 may include one or more processors 221-222 (e.g., vector signal processors VSP1 and VSPn) and associated memory 228 (e.g., RAM) for performing carrier-related signal processing and antenna-specific processing on IQ samples received from the baseband modem.

Signal processing along each transmit signal path may be divided between the processors 221-222 and shared memory 228. For example, a first vector signal processor 221 (VSP 1) may be used to scale, filter, interpolate up-sample, and combine multiple carriers into a composite carrier and then perform crest factor reduction (CFR) on the composite carrier. After crest factor reduction, the CFR-processed signal may be transferred to the shared RAM 228. At this point, a second vector signal processor 222 (VSP n) may be used to perform dynamic pre-distortion, interpolation, or other signal processing on the output IQ samples retrieved from shared memory 228. For example, retrieved IQ samples from shared RAM 228 are stored in an internal VSP buffer (not shown), up-sampled by interpolator 223 (e.g., by 2×), measured with a first power meter 224, processed through the DPD module 225, measured with a second power meter 226, and then up-sampled by interpolator 227 (e.g., by 1.25×) to a final sample rate for storage in the internal VSP buffer (not shown). The power meters 224, 226 are used to monitor the power profile of the transmit signal.

Once signal processing is completed, the transmit signal processor 220 may send the processed samples over a signal/buss line 229 to an associated serialized interface (e.g., JESD204B TX 241) for transfer to the transceiver (e.g., 250) over IQ signal lines 244. In this way, a first antenna path is formed by the connection of the transmit signal processor 220 and JESD204B TX interface 241 which are connected over IQ signal lines to transceiver 250 and antenna 253, a second antenna path is formed by the connection of the transmit signal processor 220 and JESD204B TX interface 242 which are connected over IQ signal lines 245 to transceiver 251 and antenna 254, and a third antenna path is formed by the connection of the transmit signal processor 220 and JESD204B TX interface 243 which are connected over IQ signal lines 246 to transceiver 252 and antenna 255.

With each transmit signal path between the OFF processor 201 and antennas 253-255, the output signal (e.g., 244) provided to the RF transmit front end (e.g., 250) is amplified by RF power amplifier circuitry (e.g., 259) which can generate out-of-band spurious emissions or otherwise add non-linear distortion to the amplified signal. To maintain linear operation and prevent or reduce distortion, digital pre-distortion (DPD) systems are used to compensate for the intrinsic distortion characteristics of non-linear power amplifier devices.

Pre-distortion in the baseband domain is performed by creating a function 'G' that acts upon the signal $\underline{x}[n]$ prior to power amplification that has transfer function 'H', so when the pre-distorted version of $\underline{x}[n]$, called $\underline{y}[n]$, is inserted to the power amplifier, the overall power amplifier output is linear (or at least, less non-linear). There are a variety of techniques for generating the predistortion function, such as using mathematical models to represent the power amplifier and computing an inverse of the model or using curve-fitting methods (e.g., Secant, Newton's Discrete method, and the like) to adapt the function 'G' such that $H*\underline{y}[n]=\sim g*\underline{x}[n]$, where g is the amplifier gain. However, there is a significant processing complexity and other costs associated with implementing such DPD algorithms, such as the substantial digital processing required to evaluate the complex polynomial models of the power amplifier.

Figure 4:
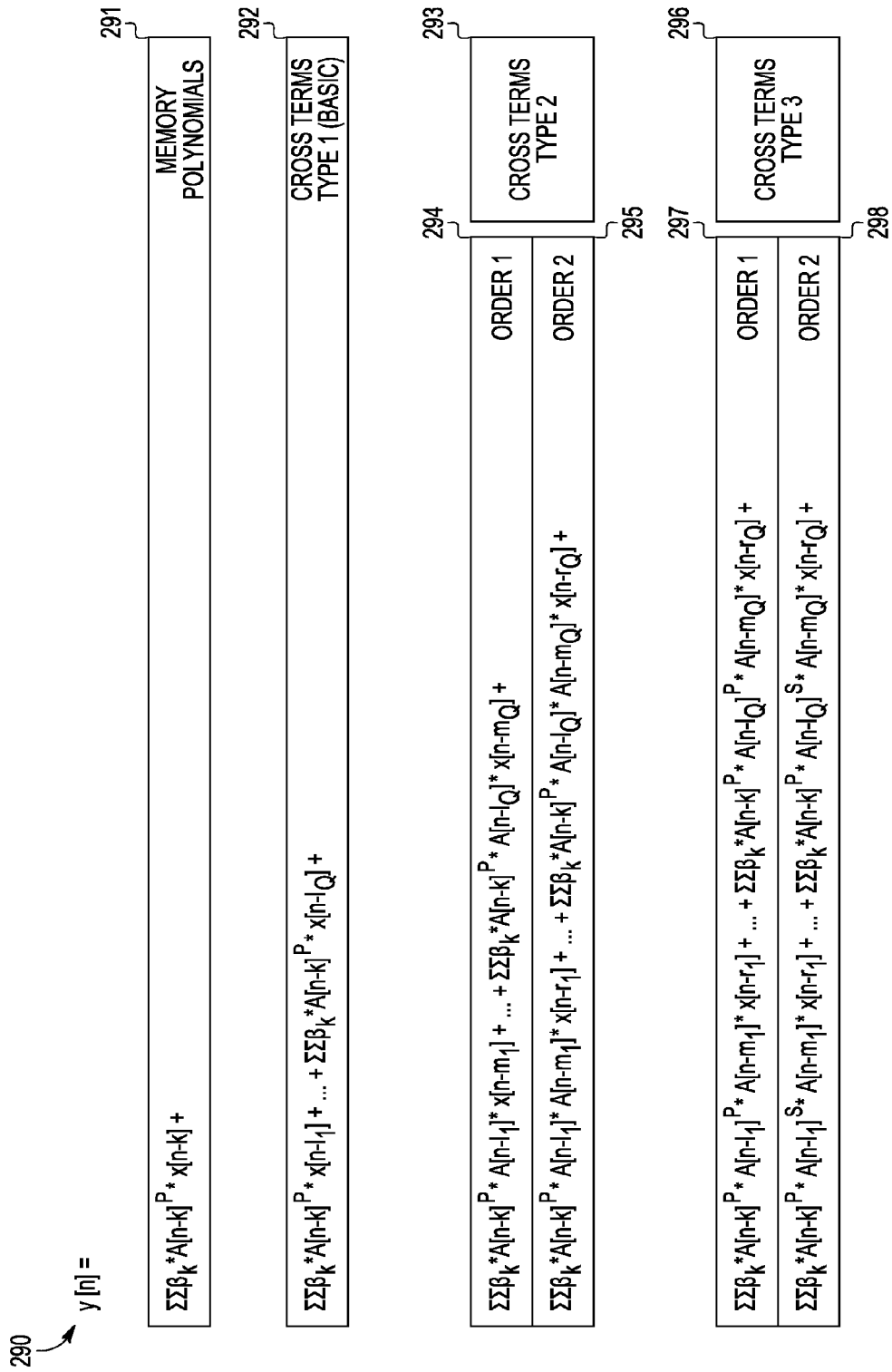
FIG. 4 illustrates the equation for a generic Volterra series approximation model.

For example, FIG. 4 illustrates a Generic Volterra Series Approximation (GVSA) model of a power amplifier with a complex polynomial defined by a set of complex polynomial filtering coefficients $\{\beta_k, k=[0:K-1]\}$ in a functional power series of the equation 290 in which y[n] is computed as the sum of the memory polynomial terms 291, type 1 cross terms 292, type 2 cross terms 293, and type 3 cross terms 296. The order of the term—such as $1^{st}$ order, $2^{nd}$ order, etc. refers to the dynamicity of the model, and determines the number of terms (in addition to the main term) that take part in any cross-correlation computation between samples from more than one time point to account for memory effects.

In the example shown in FIG. 4, $\underline{y}[n]$ is computed as the sum of the memory polynomial terms 291 (e.g., $\Sigma\Sigma\beta_k*A[n-k]^P*x[n-k]$), type 1 cross terms 292 (e.g., $\Sigma\Sigma\beta_k*A[n-k]^P*x[n-l_1]+\ldots+\Sigma\Sigma\beta k*A[n-k]^P*x[n-l_Q]$), first order type 2 cross terms 294 ($\Sigma\Sigma\beta_k*A[n-k]^P*A[n-l_1]*x[n-m_1]+\ldots+\Sigma\Sigma\beta_k*A[n-k]^P*A[n-l_Q]*x[n-m_Q]$), second order type 2 cross terms 295 ($\Sigma\Sigma\beta_k*A[n-k]^P*A[n-l_1]*A[n-m_1]*x[n-r_1]+\ldots+\Sigma\Sigma\beta_k*A[n-k]^P*A[n-l_Q]*A[n-m_Q]*x[n-r_Q]$), first order type 3 cross terms 297 ($\Sigma\Sigma\beta_k*A[n-k]^P*A[n-l_1]^P*A[n-m_1]*x[n-r_1]+\ldots+\Sigma\Sigma\beta_k*A[n-k]^P*A[n-l_Q]^P*A[n-m_Q]*x[n-r_Q]$), and second order type 3 cross terms 298 ($\Sigma\Sigma\beta_k*A[n-k]^P*A[n-l_1]^S*A[n-m_1]*x[n-r_1]+\ldots+\Sigma\Sigma\beta_k*A[n-k]^P*A[n-l_Q]^S*A[n-m_Q]*x[n-r_Q]$).

In the example Volterra power series equation 290, $\underline{y}[n]$ is the DPD output (IQ complex sample) and $\underline{x}[n]$ is the DPD input (IQ complex sample). In addition, A[n] is the real-valued amplitude of the DPD input (e.g., abs($\underline{x}[n]$), $\beta_k$ is the coefficient of the filtering, and P is the order of the polynomial degree. The double integral function $\Sigma\Sigma$ runs over k=[0:K-1], p=[0:P-1] or s=[0:S-1]. In addition, the terms $l_q$, $m_q$, $r_q$ are constant delays for each predistorter hardware cells 260, 276, 277 (total number of offsets=Q).

As will be appreciated, computation of the power series terms y[n], such as the Volterra power series equation 290, can be done either directly or using lookup-tables. With direct implementation, the DPD function would require a large number of multiplications to construct the nonlinear and memory terms, and this number increases significantly with K, P, S and Q. As a result, existing DPD solutions have embodied only partial computations of the Volterra power series equation 290, generating only the memory polynomial terms and basic type 1 cross terms. In contrast, lookup-tables implementations are much more efficient (e.g., 5× more efficient) in device area, resulting in reduced power consumption with minimal or no impact on DPD linearization performance.

In accordance with selected embodiments of the present disclosure, the DPD module 225 is provided for efficiently evaluating a complex polynomial 290 by providing the DPD module 225 with a plurality of basic predistorter hardware cells 260, 276, 277 for generating q different Volterra terms (e.g., $\underline{y}_{B1}$, $\underline{y}_{B2}$, ... $\underline{y}_{BQ}$), of a complex polynomial of order P based on N complex input Values (e.g., $\underline{x}[n]=(x_0, x_1, \ldots x_N)$). The main components of the depicted DPD module 225 include a first vector magnitude computation unit 261, a first delay line 262 for holding K−1:0 absolute samples, a second delay line 263 for holding K−1:0 complex samples, and a plurality of basic predistorter hardware cells 260, 276, 277. The first vector magnitude computation unit 261 computes, generates or retrieves the absolute value or vector magnitude ABS( ) for the input data samples $\underline{x}[n]$. The first delay line 262 holds the last M (e.g., M=32) absolute values of the input complex samples $\underline{x}[n]$ received from the first vector magnitude computation unit 261. The second delay line 263 holds the last M (e.g., M=32) input complex samples $\underline{x}[n]$. The plurality of basic predistorter hardware cells may be embodied as Q (e.g., Q=8) identical basic predistorter hardware cell units, where each basic predistorter hardware cell (e.g., 260) includes a multi-stage multiply and accumulate hardware or firmware structure including a pair of input multiplexers 264, 265, a first stage multiplier 266 and multiplexer 267, a look-up table 268, a second stage multiplier 271 and multiplexer 272 with an absolute value input multiplexer 269, and a third stage multiplier 273 and multiplexer 274 with a complex absolute value input multiplexer 270. The different Volterra terms are accumulated at an adder circuit 275 to generate a complex polynomial at the DPD output (e.g., $\underline{y}[n]=\underline{y}_{B1}+\underline{y}_{B2}, + \ldots, \underline{y}_{BQ}$).

In operation, each basic predistorter hardware cell (e.g., BPC 260) receives absolute sample values (A[n]) from a first delay line 262 that holds the last M absolute values of the input complex samples ($\underline{x}[n]$) and also receives complex sample values from the second delay line that holds the last M input complex samples ($\underline{x}[n]$. In addition, each of Q identical predistorter hardware cells includes an N-line look-up table (LUT) 268 which performs linear interpolation between LUT values to decrease quantization error. Using the product of one or more absolute sample values to index into the LUT 268, the resulting LUT outputs provide product terms (e.g., β*A[n−k]) which are multiplied with additional absolute sample values (e.g., A[n−l]) or complex sample values (e.g., $\underline{x}[n-k]$) using a combination of multiplier and multiplexer hardware circuits so that the output of each predistorter hardware cell may be combined at an adder circuit 275 to generate the DPD output sum (e.g. $\underline{y}[n]$).

In the depicted DPD module 225, a pair of K-input multiplexers 264, 265 (e.g., K=32:1 MUXes) provides first and second absolute sample values obtained from the first delay line 252 for multiplication at a first stage (STAGE 1) multiplier circuit 266 which performs a real number multiplication operation. The resulting product output from the first stage multiplier circuit 266 is connected to a first stage multiplexer 267 which also receives an absolute sample value from one of the input multiplexers (e.g., 264) which bypasses the multiplier circuit 266. The selected output from the first stage multiplexer 267 is supplied as an index to the LUT 268. In an example embodiment, the LUT 268 stores 128×4=512 entries with linear interpolation. In addition, the LUT 268 may provide linear interpolation between LUT values to reduce quantization error. The output from the LUT 268 is connected to a second stage (STAGE 2) multiplier circuit 271 which also receives an absolute sample value input obtained from the absolute value K-input multiplexer 269 (e.g., K=32:1 MUX). In this configuration, the second stage multiplier circuit 271 performs a half complex multiplication operation. The resulting product output from the second stage multiplier circuit 271 is connected to a second stage multiplexer 272 which also receives an output from the LUT 268 which bypasses the multiplier circuit 271.

At a third stage (STAGE 3) multiplier circuit 273, the selected output from the second stage multiplexer 272 is multiplied with a complex sample value obtained from the complex absolute value K-input multiplexer 270 (e.g., K=32:1 MUX). In this configuration, the third stage multiplier circuit 273 performs a complex multiplication operation, and the output from the third stage multiplier circuit 273 is connected to a third stage (STAGE 3) multiplexer 274 which also receives an empty term or "0" input. The third stage multiplexer 274 is connected to select between the empty term and the complex multiplication output from the third stage multiplier circuit 273 for output as a first output term (e.g., $y_{B1}$) from the basic predistorter hardware cell (e.g., BPC 260). In this way, different output terms (e.g., $y_{B1}$, $y_{B2} \ldots y_{BQ}$) from different predistorter cells (e.g., 260, 276, 277) may be combined or added at the shared adder circuit 275 to generate the DPD output (e.g., $\underline{y}[n]=\underline{y}_{B1}+\underline{y}_{B2}, + \ldots \underline{y}_{BQ}$). For example, each of the basic predistorter hardware cells 260, 276, 277 is capable of implementing one of the following GVSA memory polynomials or first order cross terms for types 1, 2 and 3:

a. $y[n]=\Sigma\beta*A[n]^P$ (Static polynomial term)
   b. $y[n]=\Sigma\beta*A[n-k]^P$ (a single memory polynomial term)
   c. $y[n]=\Sigma\beta*A[n-k]^P*A[n-l]$ (a single memory $1^{st}$ order Volterra model term)
   d. $y[n]=\Sigma\beta*A[n-k]^P*A[n-l]*A[n-m]$ (a single memory $2^{nd}$ order Volterra model term)
   e. $y[n]=\Sigma\beta*A[n-k]^P*A[n-l]^P*A[n-m]*A[n-r]$ (a single memory $3^{rd}$ order Volterra model term)
   where l, m, and r are constant delays.

In selected embodiments, the single chip digital front end processor 201 performs digital pre-distortion on a composite multi-carrier waveform by using the integrated predistorter hardware cells 260, 276, 277 to perform Volterra's processing algorithm to calculate polynomial values from a complex input vector.

However, it will be appreciated that the digital predistortion functionality provided is not constrained to a specific mathematical model, such as Volterra, since the LUT can represent any form of function, not only a power series model. For example, the depicted DPD module 225 may be used to implement any other LUT-based function with or without cross-correlation term multiplication, allowing for direct adaptation solutions for generating the predistortion function 'G' using curve-fitting methods, such as Secant, Newton's Discrete method, and the like. By implementing direct adaptation methods with look-up tables, the DPD module 225 is not constrained to a specific mathematical model such as Volterra, since the LUT 268 can represent any form of function, not only a power series model. Also, the ability of the DPD module 225 to provide a more elaborate mathematical DPD model with more power series terms reduces the complexity of direct adaptation solutions, as compared to traditional curve-fitting methods.

In order to generate higher order Volterra terms, selected embodiments of the present disclosure provide for the interconnection of different predistorter hardware cells into a cascaded arrangement by including additional input and output ports at each, predistorter hardware cell. For example, reference is now made to FIG. 5 which depicts a simplified block diagram illustration of a digital predistorter module 300 with additional input/output ports $x_{in}[n]$, $C_{in}[n]$, $C_{out}[n]$, $x_{out}[n]$, $y_{in}[n]$ which may be used to cascade multiple predistorter hardware cells to evaluate higher order Volterra terms in accordance with selected embodiments of the present disclosure. Connected in essentially the same arrangement as the DPD module 225 shown in FIG. 3, the digital predistorter module 300 may be embodied with a first vector magnitude computation unit 361, a first delay line 362, a second delay line 363, a plurality Q (e.g., Q=8) identical basic predistorter hardware cell units 301, 302, 303, and a shared output adder circuit 375 connected as shown. In each basic predistorter hardware cell (e.g., 301), there is connected a multi-stage multiply and accumulate hardware or firmware structure including a pair of K-input multiplexers 364, 365, a first stage multiplier 366 and multiplexer 367, an N-line look-up table (LUT) 368, a second stage multiplier 371 and multiplexer 372 with an absolute value K+1 input multiplexer 369, and a third stage multiplier 373 and multiplexer 374 with a complex absolute value K-input multiplexer 370. However, the digital predistorter module 300 also includes additional circuitry and connection ports for conveying inputs or outputs to or from other basic predistorter hardware cell units 301, 302, 303. The additional circuitry includes a K-input multiplexer 360 which receives and selects between a first input complex sample 380 ($x[n]$) and a second complex sample 381 ($x_{in}[n]$) for output to the first vector magnitude computation unit 361 and second delay line 363. In addition, the absolute value K+1 input multiplexer 369 is provided with an, input port 382 for receiving an input term $C_{in}[n]$, such a second stage (STAGE 2) output from another basic predistorter hardware cell unit. In addition, a second stage output connection line or port 382 may be provided at the output of the second stage multiplexer 372 for providing an output term $C_{out}[n]$ for possible input to another basic predistorter hardware cell unit. The second delay line 363 may also include an output connection line or port 383 for providing an output term $x_{out}[n]=x[n-K-1]$ for possible input to another basic predistorter hardware cell unit. Likewise, the shared output adder circuit 375 may be implemented as a Q+1 input adder which includes an input connection line or port 384 for receiving an input term $y_{in}[n]$, such as an output term from another basic predistorter hardware cell unit.

In the depicted DPD module 300, the K-input multiplexer 360 chooses between the first and second first input complex samples $x[n]$, $x_{in}[n]$) for input to the first vector magnitude computation unit 361 and second delay line 363. From the first delay line 362, first and second absolute sample values (e.g., $A_1[n]$, $A_2[n]$) provided by the K-input multiplexers 364, 365 are processed at the first stage (STAGE 1) multiplier circuit 366 and multiplexer 367 to generate index inputs to the interpolation LUT 368. At the second stage (STAGE 2), the second stage multiplier circuit 371 multiplies the output from the LUT 268 and the input provided by the K+1 input multiplexer 369 which chooses between the absolute sample value input $A[n]$ and the input term $C_{in}[n]$ received at the input port 382. The resulting product output from the second stage multiplier circuit 371 and a bypass output from the LUT 368 are connected to the second stage multiplexer 372 which generates an output term $C_{out}[n]$ at the second stage output connection line or port 382. This same output term $C_{out}[n]$ is multiplied at the third stage (STAGE 3) multiplier circuit 373 with a complex sample value obtained from the complex absolute value K-input multiplexer 370. The output from the third stage multiplier circuit 373 is connected as an input to the third stage (STAGE 3) multiplexer 374 which also receives the empty term or "0" input. As a result, the third stage multiplexer 374 chooses between the empty term and the complex multiplication output from the third stage multiplier circuit 373 for output as a first output term (e.g., $y_{B1}$) from the basic predistorter hardware cell (e.g., BPC 301). In this Way, different output terms (e.g., $y_{B1}$, $y_{B2}$ ... $y_{BQ}$) from different predistorter cells (e.g., 301-303) may be combined or added at the shared adder circuit 375 which also receives the input term $y_{in}[n]$ from the input connection line or port 384. The resulting output from the shared adder circuit 375 is the DPD output (e.g., $y[n]=y_{in}[n]+y_{B1}+y_{B2},+ \ldots y_{BQ}$).

Figure 6:
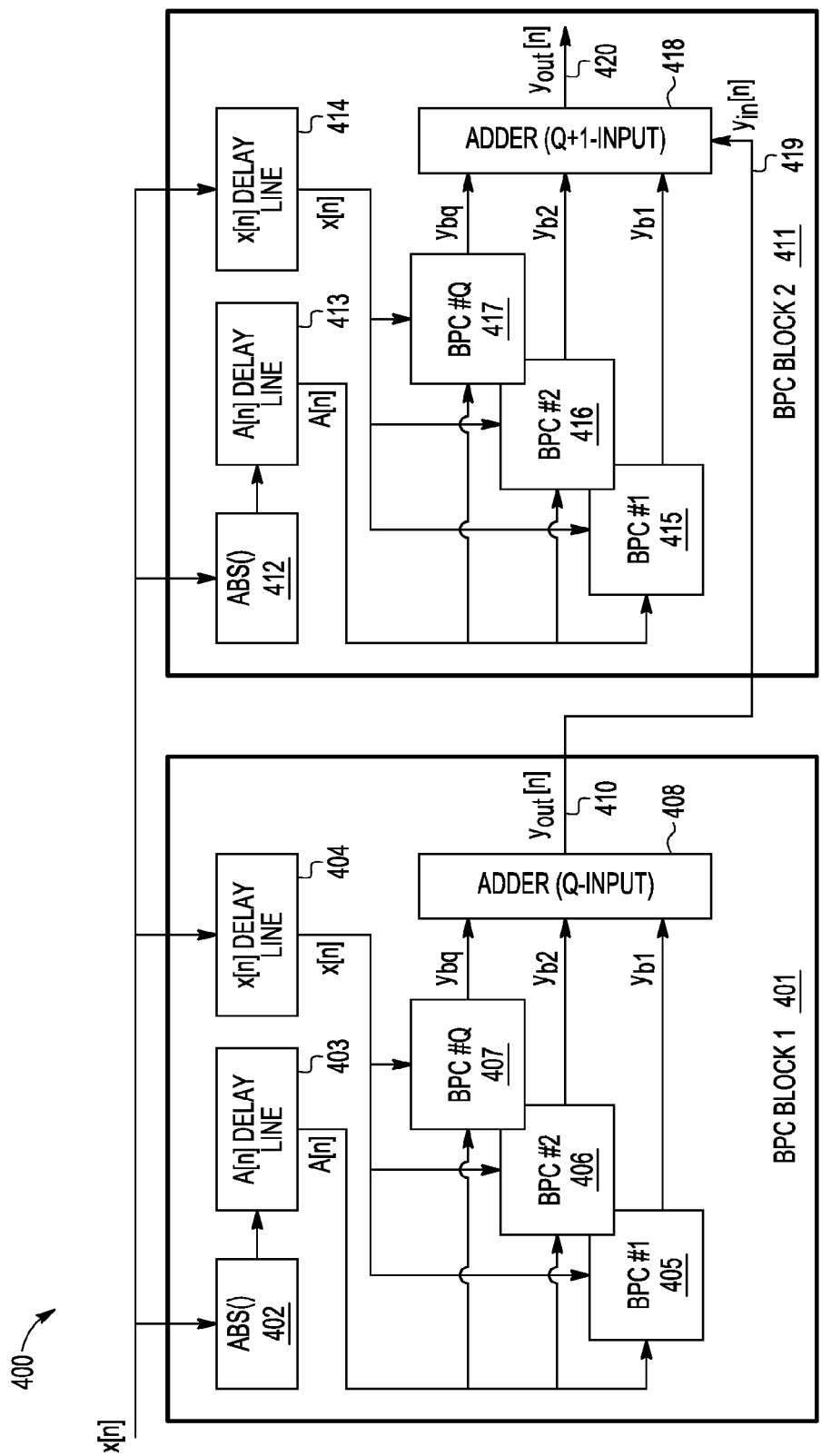
FIG. 6 is a simplified block diagram illustration of two digital predistorter hardware cells which are cascaded by adder expansion to evaluate higher order Volterra terms in accordance with selected embodiments of the present disclosure.

With the multi-port DPD module 300 it will be appreciated that a single basic predistorter hardware cell unit can be configured to compute the first order cross term type 1, $\Sigma\beta_k*X[n-k]^P*X[n-m_1]*x[n-r_1]$. However, by cascading two basic predistorter hardware cell units using the additional input/output ports $x_{in}[n]$, $C_{in}[n]$, $C_{out}[n]$, $x_{out}[n]$, $y_{in}[n]$, higher order Volterra terms may be evaluated in accordance with selected embodiments of the present disclosure. For example, reference is now made to FIG. 6 which shows a simplified block diagram illustration of a cascaded circuit 400 having two digital basic predistorter cell (BPC) blocks 401, 411 which are connected to receive the same input complex sample $x[n]$, where the BPC blocks 401, 411 include adder circuits 408, 418 connected in an adder expansion configuration so that an output term $y_{out}[n]$ from the adder circuit 408 is provided as an input $y_{in}[n]$ to the Q+1 adder circuit 418. Connected in essentially the same arrangement as the DPD module 225 shown in FIG. 3, each BPC block 401, 411 includes a first vector magnitude computation unit 402, 412, a first delay line 403, 413, a second delay line 404, 414, a plurality of Q identical basic predistorter cells 405-407, 415-417, and a shared output adder circuit 408, 418 connected as shown. Though not shown, each basic predistorter cell (BPC) is connected as a multi-stage multiply and accumulate hardware or firmware structure including a pair of K-input multiplexers, a first stage multiplier and multiplexer, an N-line look-up table (LUT), a second stage multiplier and multiplexer with an absolute value input multiplexer, and a third stage multiplier and multiplexer with a complex absolute value K-input multiplexer, substantially as disclosed in FIG. 3. In addition, each BPC block 401, 411 also includes additional circuitry and connection ports for conveying inputs or outputs to or from other BPC blocks. In particular, the first BPC block 401 includes a shared Q-input adder circuit 408 having an output 410 that provides an output term $y_{out}[n]$ directly to the input connection line or port 419 at the shared Q+1 adder circuit 418 of the second BPC block 411. With the configuration of the depicted cascaded circuit 400, it will be appreciated that the shared Q-input adder circuits 408, 418 may both be implemented as Q+1 adder circuits if desired. In any case, the resulting output 420 $y_{out}[n]$ from the BPC block 411 doubles the number of Volterra terms with time span defined by delay lines.

Figure 7:
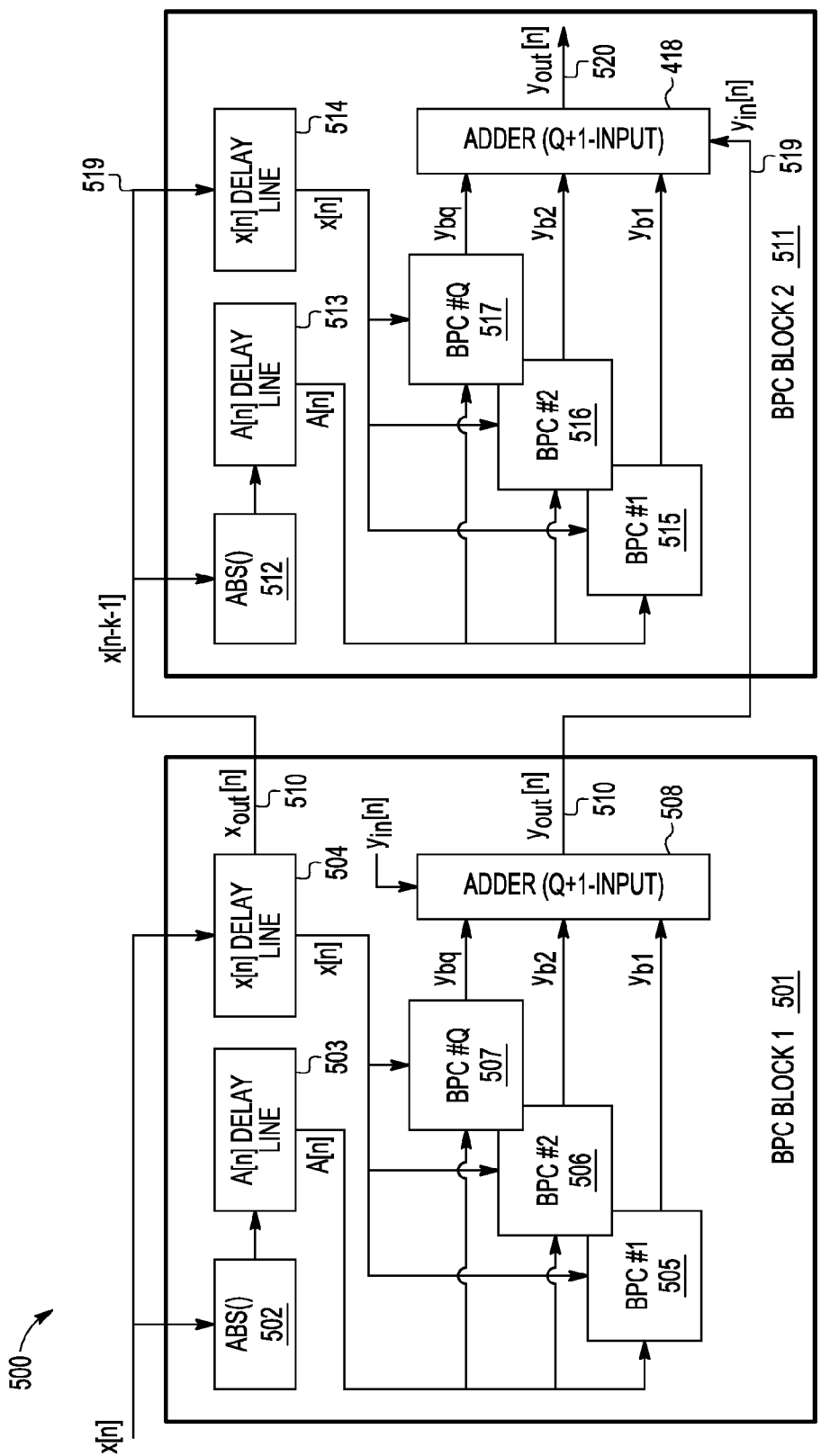
FIG. 7 is a simplified block diagram illustration of two digital predistorter hardware cells which are cascaded by signal delay line concatenation to evaluate higher order Volterra terms in accordance with selected embodiments of the present disclosure.

As will be appreciated, other cascading arrangements may use additional input/output ports $x_{out}[n]$, $y_{in}[n]$ to achieve higher order Volterra terms in accordance with selected embodiments of the present disclosure. For example, reference is now made to FIG. 7 which shows a simplified block diagram illustration of a cascaded circuit 500 having two digital basic predistorter cell (BPC) blocks 501, 511 which are connected using a signal delay line concatenation whereby the first BPC block 501 receives the input complex sample x[n], while the second BPC block 511 receives a delayed version of the input complex sample x[n] provided by the second delay line 504 in the first BPC block 501. In addition, both BPC blocks 501, 511 include adder circuits 508, 518 connected in an adder expansion configuration so that an output term $y_{out}$[n] from the adder, circuit 508 is provided as an input $y_{in}$[n] to the Q+1 adder circuit 518. Connected in essentially the same arrangement as the cascaded circuit 400 shown in FIG. 6, each BPC block 501, 511 includes a first vector magnitude computation unit 502, 512, a first delay line 503, 513, a second delay line 504, 514, a plurality Q identical basic predistorter cells 505-507, 515-517, and a shared output adder circuit 508, 518 connected as shown. In addition, the BPC blocks 501, 511 also include additional circuitry and connection ports for conveying inputs or outputs to or from other BPC blocks. In particular, the first BPC block 501 includes an output connection line or port 510 from the second delay line 504 for providing an output term $x_{out}$[n]=x[n-K-1] for direct input to an input connection line or port 519 at the second delay line 514 of the second BPC block 511. Again, the shared Q-input adder circuits 508, 518 may both be implemented as Q+1 adder circuits if desired. In any ease, the configuration of the depicted cascaded circuit 500 uses the concatenated signal delay lines 504, 515 to generate an output 520 $y_{out}$[n] from the BPC block 511 that doubles the number and memory span of the Volterra terms.

Figure 8:
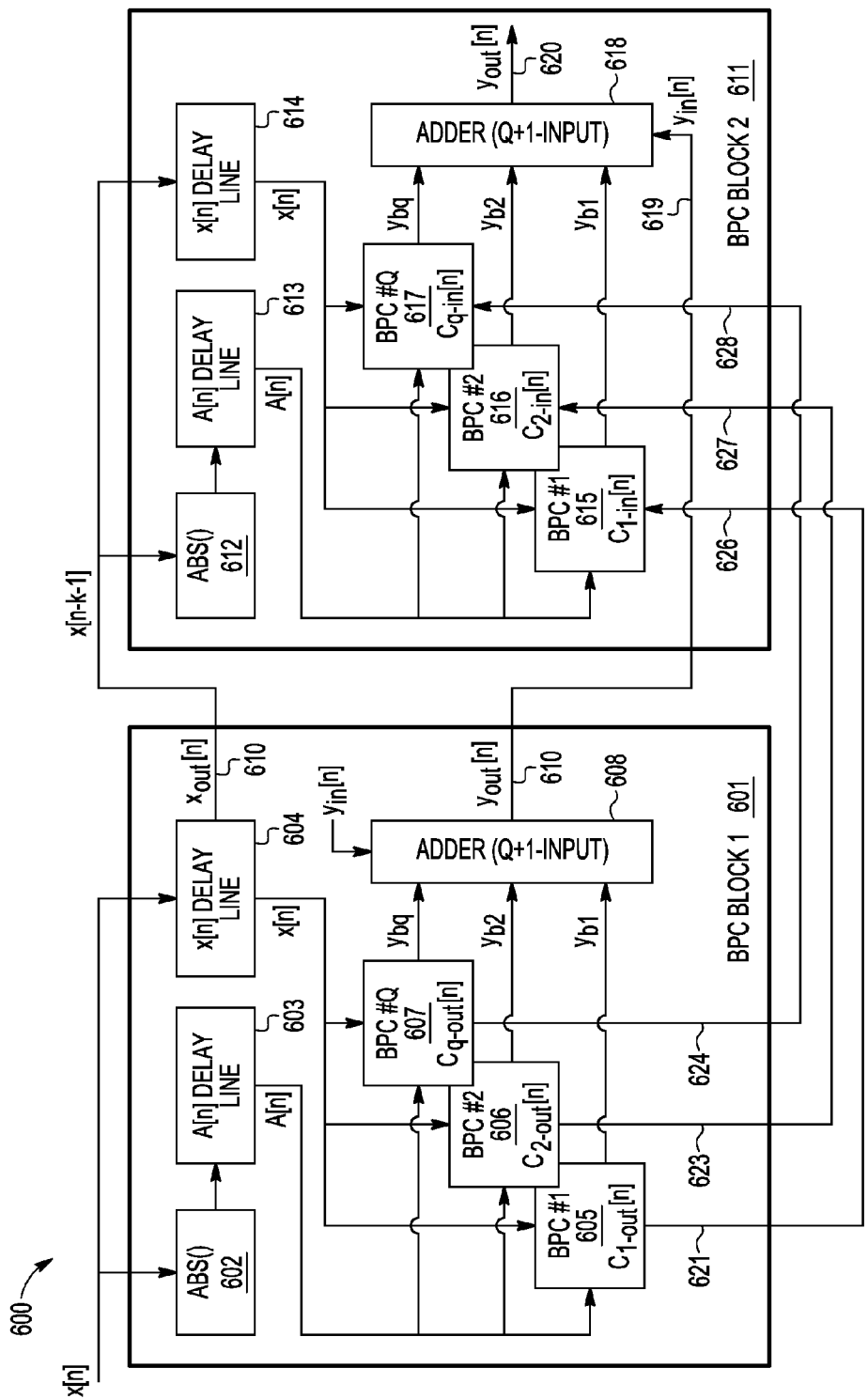
FIG. 8 is a simplified block diagram illustration of two digital predistorter hardware cells which are cascaded by extension ports and signal delay lines to evaluate higher order Volterra terms in accordance with selected embodiments of the present disclosure.

With yet other cascading arrangements, the BPC blocks may be connected with, additional input/output ports $x_{out}$[n], $y_{in}$[n], $C_{out}$[n], $C_{in}$[n] to achieve higher order Volterra terms in accordance with selected embodiments of the present disclosure. For example, reference is now made to FIG. 8 which shows a simplified block diagram illustration of a cascaded circuit 600 having two digital basic predistorter cell (BPC) blocks 601, 611 which are connected using BPC extension ports so that an output port $C_{out}$[n] at each BPC in a first BPC block is directly connected to an input port $C_{in}$[n] of a corresponding BPC in a second BPC block. In addition, the BPC blocks 601, 611 are connected using a signal delay line concatenation arrangement whereby the first BPC block 601 receives the input complex sample x[n], while the second BPC block 611 receives a delayed, version of the input complex sample x[n] provided by the second delay line 604 in the first BPC block 601. In addition, both BPC blocks 601, 611 include adder circuits 608, 618 connected in an adder expansion configuration so that an output term $y_{out}$[n] from the adder circuit 608 is provided as an input $y_{in}$[n] to the Q+1 adder circuit 618. Connected in essentially the same arrangement as the cascaded circuit 500 shown in FIG. 7, each BPC block 601, 611 includes a first vector magnitude computation unit 602, 612, a first delay line 603, 613, a second delay line 604, 614 (including an output connection line or port 610), a plurality Q identical basic predistorter cells 605-607, 615-617, and a shared output adder circuit 608, 618 (including an input output connection line or port 619) connected as shown. In addition, the BPC blocks 601, 611 also include additional circuitry and connection ports for conveying inputs or outputs to or from other BPC blocks. In particular, the first BPC block 601 includes an output connection line or port 621 from BPC #1 605 for providing an output, term $C_{1-out}$[n] for direct input as input term $C_{1-in}$[n] to an input connection line or port 626 at BPC #1 615 of the second BPC block 611. In similar fashion, the first BPC block 601 includes additional output connection lines or ports 623, 624 from additional BPCs 606, 607 for providing output terms $C_{2-out}$[n], $C_{3-out}$[n] for direct input as input terms $C_{2-in}$[n], $C_{3-in}$[n] to the input connection lines or ports 627, 628 at BPCs 616, 617 of the second BPC block 611. With the configuration of the depicted cascaded circuit 600, it will be appreciated that the cascading of BPC blocks uses the BPC extension ports and signal delay line to generate an output 620 $y_{out}$[n] from the BPC block 611 that doubles the number, order, and memory span of the Volterra terms.

Figure 9:
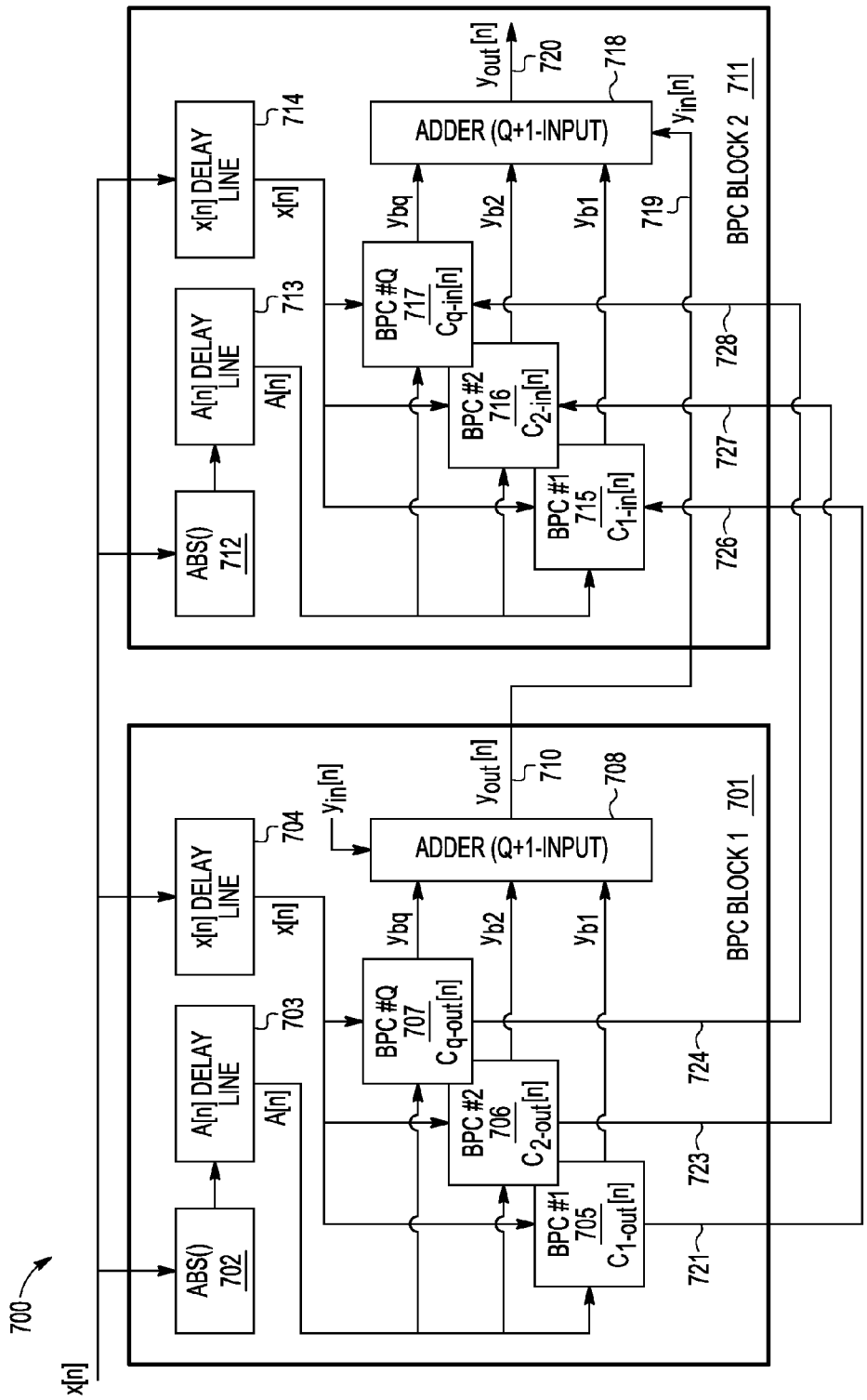
FIG. 9 is a simplified block diagram illustration of two digital predistorter hardware cells which are cascaded by extension ports to evaluate higher order Volterra terms in accordance with selected embodiments of the present disclosure.

In yet another cascading arrangement shown in FIG. 9, the BPC blocks ma be connected with additional input/output ports $y_{in}$[n], $C_{out}$[n], $C_{in}$[n] to achieve higher order Volterra terms in accordance with selected embodiments of the present disclosure. As illustrated with the simplified block diagram illustration of a cascaded circuit 700 two digital basic predistorter cell (BPC) blocks 701, 711 may be connected to receive the same input complex sample x[n], and may also be connected together using BPC extension ports so that an output port $C_{out}$[n] at each BPC in a first BPC block 701 is directly connected to an input port $C_{in}$[n] of a corresponding BPC in a second BPC block 711. In addition, both BPC blocks 701, 711 include adder circuits 708, 718 connected in an adder expansion configuration so that an output term $y_{out}$[n] from the adder circuit 708 is provided as an input $y_{in}$[n] to the Q+1 adder circuit 718. Connected in essentially the same arrangement as the cascaded circuit 600 shown in FIG. 8 except for the shared input complex sample x[n], each BPC block 701, 711 includes a first vector magnitude computation unit 702, 712, a first delay line 703, 713, a second delay line 704, 714, a plurality Q identical basic predistorter cells 705-707, 715-717, and a shared output adder circuit 708, 718 (including an input output connection line or port 719) connected as shown. In addition, the BPC blocks 701, 711 also include additional circuitry and connection ports for conveying inputs or outputs to or from other BPC blocks. In particular, the first BPC block 701 includes output connection lines or ports 721-724 at each BPC 705-707 for providing a corresponding output term $C_{1-out}$[n], $C_{2-out}$[n], $C_{3-out}$[n] for direct input as input term $C_{1-in}$[n], $C_{2-in}$[n], $C_{3-in}$[n] to an input connection line or port 726-728 at each BPC 715-717 of the second BPC block 711. With the configuration of the depicted cascaded circuit 700 in which BPC blocks are cascaded using the BPC extension ports, the generated output 720 $y_{out}$[n] from the BPC block 711 doubles the number and order of the Volterra terms within the delay line time-span. In particular the multi-port circuit 700 of cascaded BPC blocks 701,711 shown in FIG. 9 can be used to compute the term, $\Sigma \beta_k * X[n-k]^P * \Sigma X[n-l_1]^s * X[n-m_1] * x[n-r_1]$, where the first sum is from k=0:p-1 and the second sum is from r1=0:s-1. As a result, the cascaded BPC blocks can be configured to compute the second order cross term type 3, $\Sigma \Sigma \beta_k * X[n-k]^P * X[n-l_1]^S * X[n-m_1] * x[n-r_1]$.

As described hereinabove, selected embodiments of the digital predistortion hardware 225, 300 disclosed herein may use one or more basic predistorter cells configured in various arrangements to compute not only static and memory polynomial terms and basic cross terms (e.g., cross term type 1), but also higher order Volterra terms (e.g., cross terms type 2 and 3). For example, a single basic predistorter hardware cell unit (e.g., 301) may use a static look-up table ($LUT_{STAT}$) 368 to provide the static pre-equalizing filtering coefficients $S_p$ to evaluate a static or memory-less Volterra series term $Y_S$[n] from the input complex sample X[n]:

$$Y_s[n] = \sum_{p=1}^{P} S_p |X[n]|^{p-1} X[n] = LUT_{STAT}(|X[n]|)X[n]$$

In addition, a single basic predistorter hardware cell unit (e.g., 301) may use a memory look-up table ($LUT_{MEM}$) 368 to provide the dynamic pre-equalizing filtering coefficients $M_{qp}$ to evaluate one or more memory polynomial Volterra series terms $Y_M[n]$ from the input complex sample $X[n]$:

$$Y_M[n] = \sum_{q=1}^{Q}\sum_{p=1}^{P} M_{qp}|X[n-q]|^{P-1}X[n-q] = \sum_{q=1}^{Q} LUT_{MEM}(q, |X[n-q]|)X[n-q]$$

Finally, one or more cascaded basic predistorter hardware, cell units (e.g., 400, 500, 600, 700) may use cross-term look-up tables ($LUT_{CROSS1}$, $LUT_{CROSS2}$, $LUT_{CROSS3}$) to provide the dynamic pre-equalizing filtering coefficients $C_{qp}$, $C_{qrp}$ to evaluate one or more dynamic memory cross-terms $Y_{C1}[n]$, $Y_{C2}[n]$, $Y_{C3}[n]$ from the input complex sample $X[n]$:

$$Y_{C1}[n] = \sum_{q=1}^{Q}\sum_{p=1}^{P} C_{qp}|X[n]|^P X[n-q] = \sum_{q=1}^{Q} LUT_{CROSS1}(q, |X[n]|)X[n-q]$$

$$Y_{C2}[n] = \sum_{q=1}^{Q}\sum_{r=1}^{q}\sum_{p=1}^{P} C_{qrp}|X[n]|^P|X[n-r]|X[n-q] =$$

$$\sum_{q=1}^{Q} LUT_{CROSS2}(q, |X[n]|)|X[n-r]|X[n-q]$$

$$Y_{C3}[n] = \sum_{q=1}^{Q}\sum_{r=1}^{q}\sum_{p=1}^{P} C_{qrp}|X[n]|^P|X[n-s]|^P|X[n-r]|X[n-q]$$

$$= \sum_{q=1}^{Q} LUT_{CROSS3}(s, q, |X[n]|)|X[n-r]|X[n-q]$$

As described herein, the DPD module 225 may include a plurality of N BPC blocks (e.g., 401, 411) (where N=4, 8 or larger) which are configurable to support a multi-antenna array 253-255 in different bandwidth modes.

Figure 10:
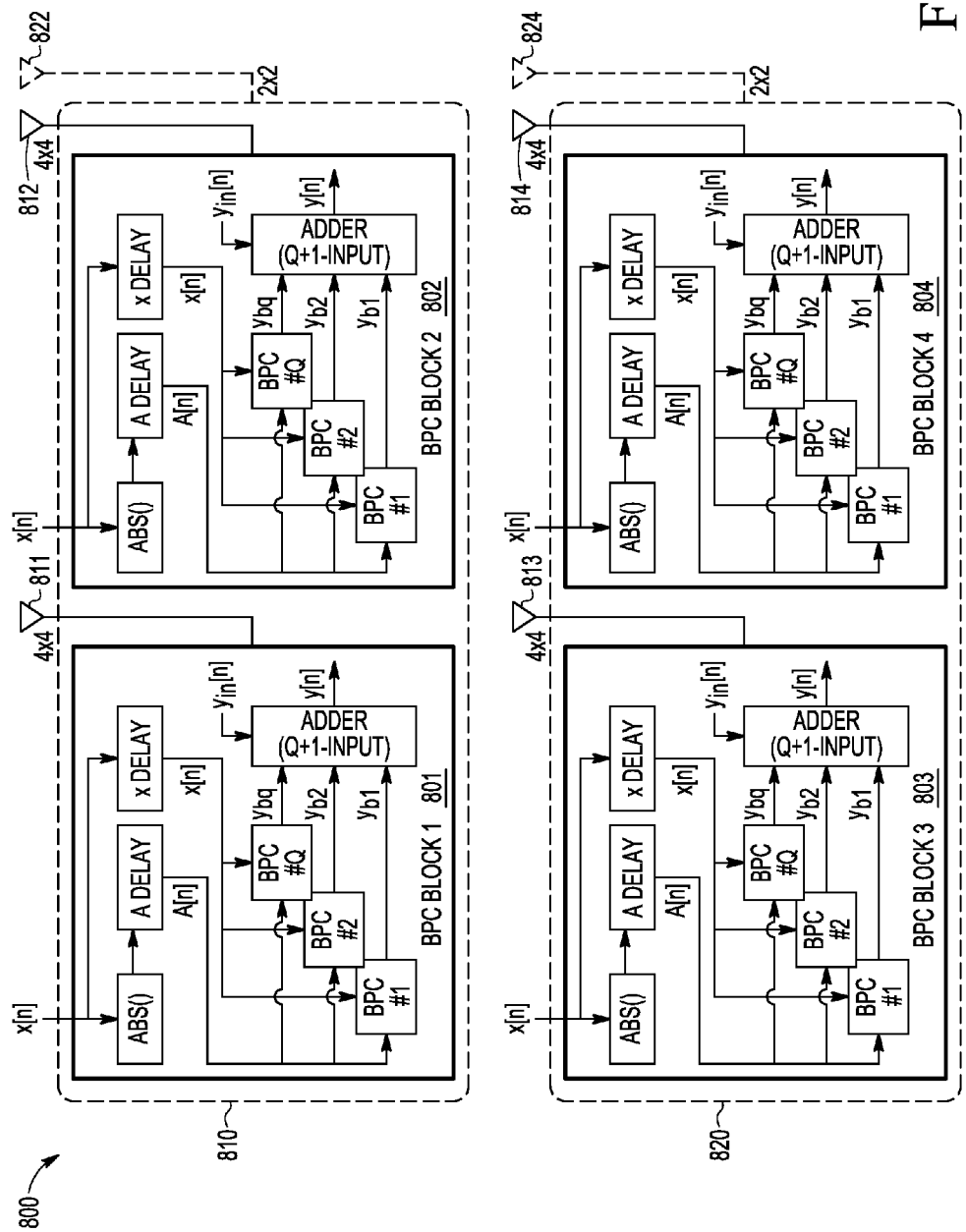
FIG. 10 is a simplified block diagram illustration of a digital front end (DFE) having four digital predistorter hardware cell blocks which may be configured in different bandwidth modes in accordance with selected embodiments of the present disclosure.

To illustrate an, example configuration, reference is now made to FIG. 10 which shows a simplified block diagram illustration of a 4×4 digital front end (DFE) 800 having four digital predistorter hardware cell blocks 801-804 which may be configured in different bandwidth modes in accordance with selected embodiments of the present disclosure. The depicted DFE 800 includes four antennas 811-814, each respectively connected to a corresponding BPC block 801-804. Each of identical BPC blocks 801-804 may be connected in essentially the same arrangement as the DPD module 300 shown in FIG. 5 to include a first vector magnitude computation unit (ABS( )), a first delay line (A DELAY), a second delay line (x DELAY), a plurality Q basic predistorter cells (BPC) (where Q=8, 16 or larger) which include a look-up table (LUT) and associated multi-stage multiply and accumulate hardware, and a shared output adder circuit (ADDER) connected as shown. With this arrangement, the DFE 800 is configurable to support different bandwidth modes, including a first 4×4 DFE configuration for a lower-bandwidth mode wherein the N BPC blocks are each configured to separately linearize one of the four transmit antennas 811-814, and a second 2×2 DFE configuration for a higher-bandwidth mode wherein the N BPC blocks are configured into two groups 810, 820 to transmit on two antennas 822, 824, thereby providing a higher-order and higher-complexity solution. Stated more generally, N BPC blocks can be mapped to, the maximum number of transmit antennas, or simultaneously approximated nonlinear functions in general, that are supported in parallel by the DFE 800. And with each BPC block including Q BPCs, it will be appreciated that Q can define the minimum complexity of a linearization function per antenna, or of a nonlinear function approximation in general, that is computed in parallel. However, in other applications, the BPCs may not be associated with antennas, but other types of information channels.

Figure 11:
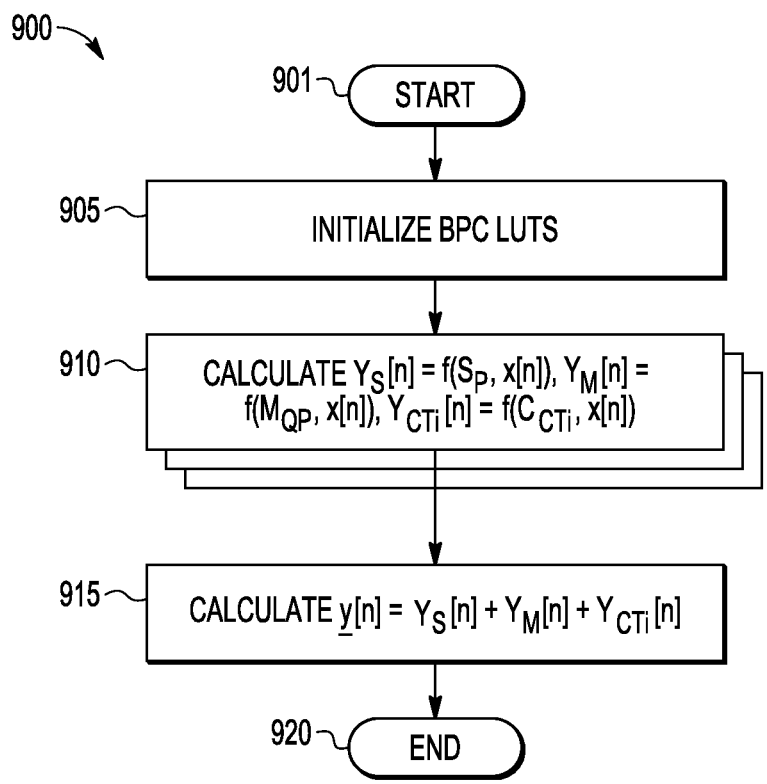
FIG. 11 shows an example flow diagram of a method for computing polynomial values using digital predistortion hardware with a plurality of LUT-based basic predistorter cells to perform Volterra algorithm evaluation of the polynomial.

Referring now to FIG. 11, there is depicted an example flow diagram 900 of a method for computing polynomial values using digital predistortion hardware to perform Volterra algorithm evaluation of the polynomial in accordance with selected embodiments of the present disclosure. In the example flow diagram 900, the method steps may be performed with a plurality of LUT-based basic predistorter cells (BPC) having a plurality of multiply/multiplex stages with cascading input/output ports which are controlled by control logic (e.g., at the DFE). The disclosed methods provide a reduced footprint, high throughput, power efficient mechanism for processing absolute or magnitude values from a complex input vector and complex polynomial coefficient values to evaluate the complex polynomial against the complex input vector, such as by finding the root(s) of the complex polynomial using Volterra's method.

Once the method starts at step 901, look-up tables at each BPC are initialized or loaded at step 905 with input values for computation of the desired Volterra terms. For example, one or more first BPCs are loaded with a static look-up table ($LUT_{MEM}$) that is used to evaluate one or more static or memory-less Volterra series terms $Y_S[n]$. In addition, one or more second BPCs are loaded with a memory look-up table ($LUT_{MEM}$) that is used to evaluate one or more memory polynomial Volterra series terms $Y_M[n]$. Finally, one or more cascaded BPCs are loaded with cross-term look-up tables ($LUT_{CROSS1}$, $LUT_{CROSS2}$, $LUT_{CROSS3}$) to provide the dynamic pre-equalizing filtering coefficients $C_{qp}$, $C_{qrp}$ to evaluate dynamic memory cross-terms $Y_{C1}[n]$, $Y_{C2}[n]$, $Y_{C3}[n]$.

Once initialization is finished, the individual Volterra series terms are calculated at step 910. At this point, the digital predistortion hardware uses the plurality of LUT-based BPCs connected on various cascade arrangements to compute not only static polynomial terms $Y_S[n]$ and memory polynomial terms $Y_M[n]$, but also higher order cross-terms, including first and second order dynamic memory cross-terms $Y_{C1}[n]$, $Y_{C2}[n]$, $Y_{C3}[n]$. For example, a static polynomial term $Y_S[n]$ may be calculated at a first BPC as a function of the static pre-equalizing filtering coefficients $S_p$ and input complex sample values x[n], while a memory polynomial term $Y_M[n]$ may be calculated at a second BPC as a function of the dynamic pre-equalizing filtering coefficients $M_{qp}$ and input complex sample values x[n]. In addition, one or more cross-terms—such as type 1 cross-term $Y_{CT1}[n]$, type 2 cross-terms $Y_{CT2}[n]$, or type 3 cross-term $Y_{CT3}[n]$—may be calculated at one or more cascaded BPCs as a function of the dynamic pre-equalizing filtering coefficients $C_{CT}$ and input complex sample values x[n].

As a final step 915, the digital predistortion hardware calculates the complex sum y[n] by adding the individual Volterra series terms computed at step 910. In this way, the digital predistortion hardware operates in parallel to calculate individual Volterra terms with pipelining of the BPC operations to simultaneously evaluate a complex polynomial against different values from a complex input vector. At step 920, the method ends.

Figure 12:
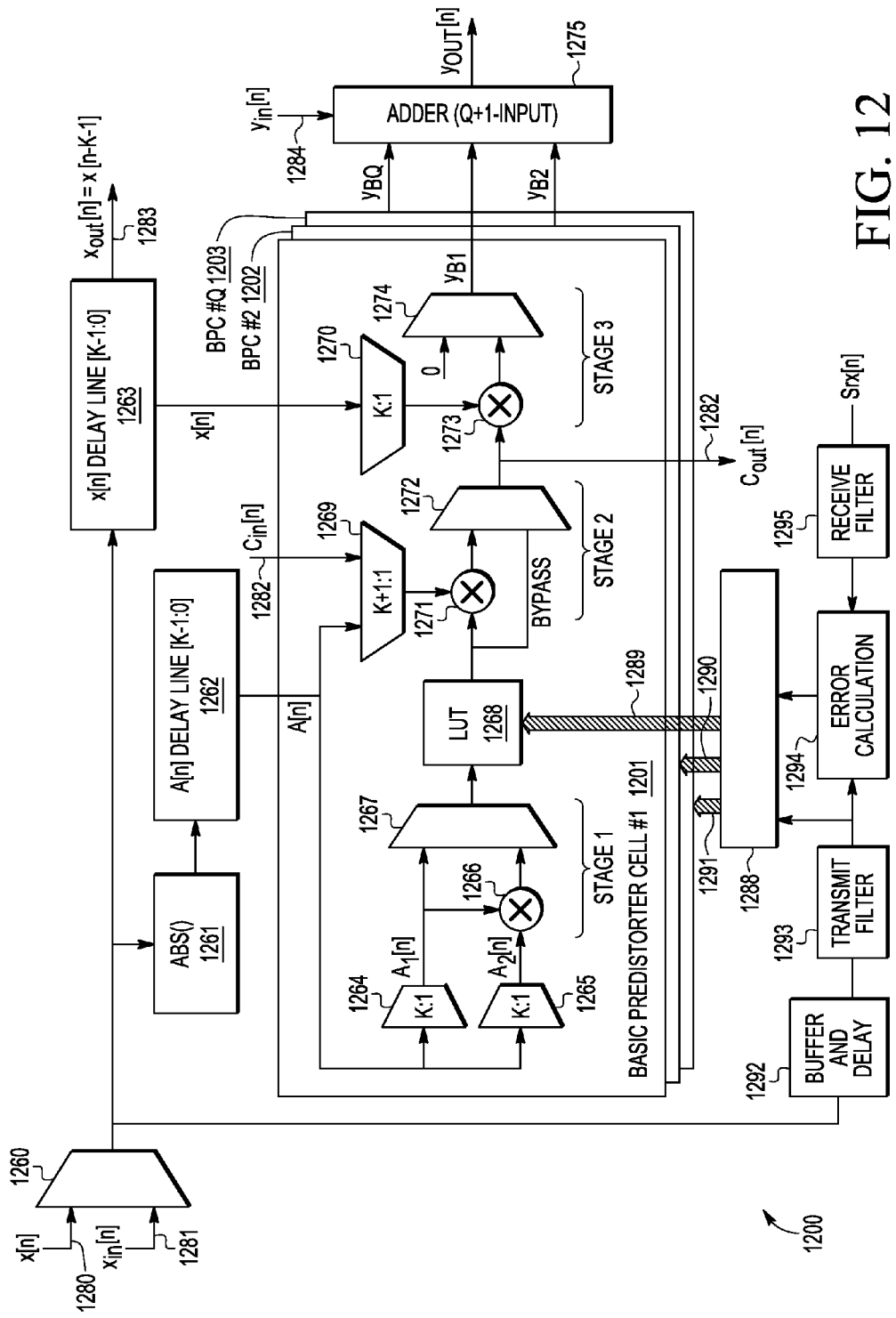
FIG. 12 illustrates a simplified block diagram of one actuator arrangement of a digital predistorter hardware cell from multiple parallel digital predistorter hardware cells in accordance with selected embodiments of the present disclosure.

DPD adaptation is required in order to update the DPD coefficients in the multiple LUTs located in the multiple BPCs, in order to track and correct for changes in the PA. There are two ways to update the coefficients, namely: indirect, where the adaptation is performed on a DPD model, and, direct, where the adaptation is performed on the LUT itself. Indirect adaptation solutions require significant amount of computational resources, whereas direct adaptation eliminates the need to build a model, and thus reduces the complexity. However, given a certain LUT-size and the number of LUTs used in a multi-BPC architecture, current direct adaptation algorithms require a long adaptation time in order to achieve required performance Reference is now made to FIG. 12, which depicts a simplified block diagram illustration of a digital predistorter module 1200 that includes multiple hardware basic predistorter cells (BPCs) 1201, 1202, 1203. In contrast to FIG. 5, the block diagram of FIG. 12 illustrates one example digital predistorter module 1200 for adaptation of a multi-LUT DPD actuator with interpolation. This example digital predistorter module 1200 introduces one or more of the following: DPD adaptation with L-lines extrapolation, a specific decay factor ('μ') per LUT, an error calculation based on the selected samples in the delay line. The digital predistorter module 1200 includes a specific number of LUTs of a certain LUT-size, in order to generate higher order Volterra terms. In this example, the number of LUTs of a certain LUT-size is dependent upon the number of BPCs 1201, 1202, 1203 in a multi-BPC architecture that is used, with one LUT 1268 shown per BPC 1201, 1202, 1203. In other examples, more than one LUT 1268 may be used per BPC 1201, 1202, 1203.

Hence, in accordance with selected embodiments of the present disclosure each BPC 1201, 1202, 1203 includes a N-line LUT 1268. In some examples, each LUT may have for example, N lines (e.g. where N=128). Notably, each N-line LUT 1268 of each BPC 1201, 1202, 1203 has an input providing 'M' lines of interpolation. In the simplest example embodiment, two of these N lines may be chosen to correspond to two interpolation M lines that are used. In accordance with selected example embodiments of the present disclosure, the M lines of interpolation for each N-line LUT 1268 of each BPC 1201, 1202, 1203 may be different. In accordance with selected embodiments of the present disclosure, the DPD adaptation may be performed using L-lines of extrapolation, for example provided by one or more error path(s), as illustrated.

Figure 5:
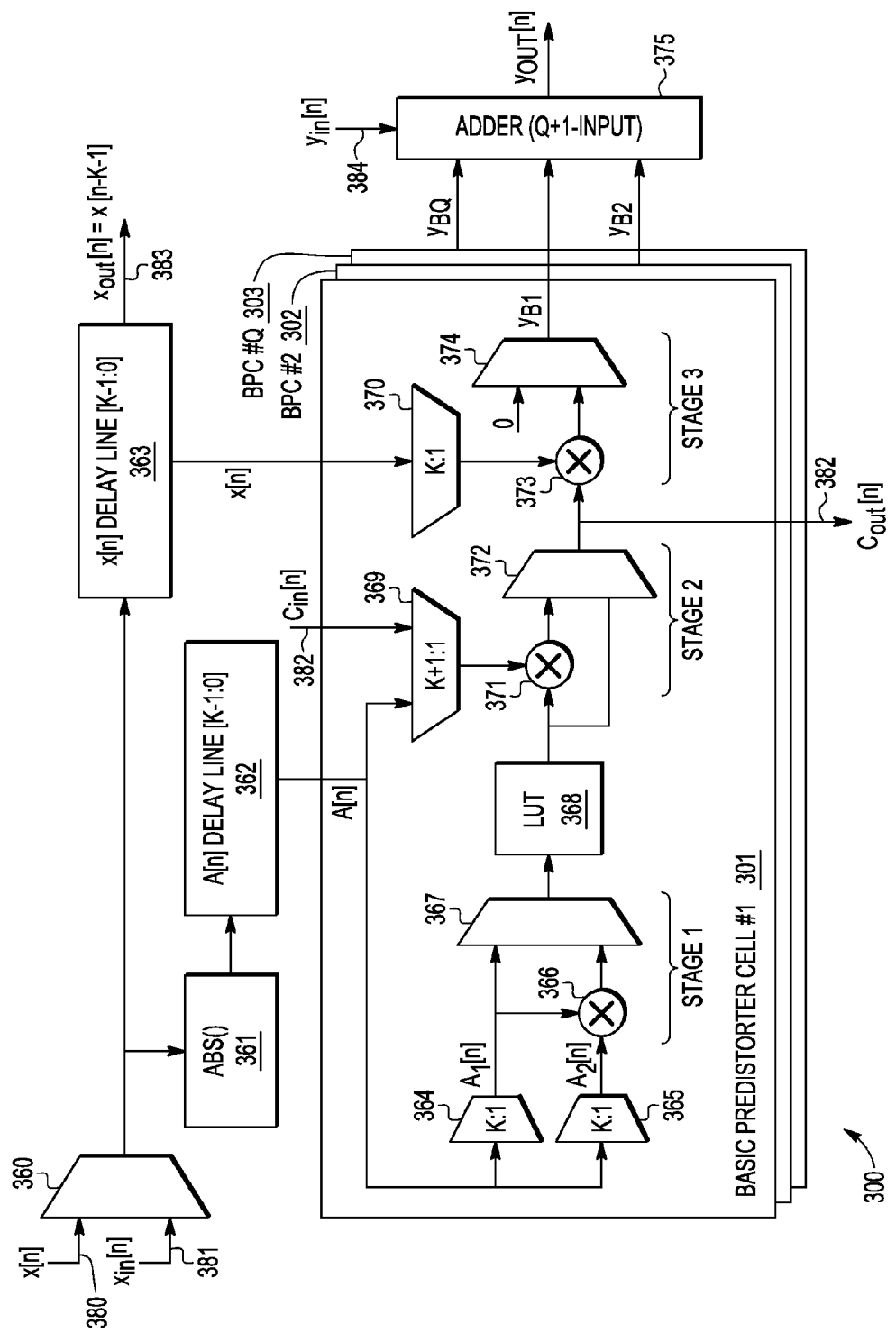
FIG. 5 is a simplified block diagram illustration of digital predistorter hardware cells with additional input/output ports to evaluate higher order Volterra terms in accordance with selected embodiments of the present disclosure.

In a similar manner to FIG. 5, the digital predistorter module 1200 includes additional input/output ports $x_{in}[n]$, $C_{in}[n]$, $C_{out}[n]$, $x_{out}[n]$, $y_{in}[n]$, which are used to cascade multiple BPCs 1201, 1202, 1203 to evaluate higher order Volterra terms. Connected in essentially the same arrangement as the DPD module 225 shown in FIG. 3, the digital predistorter module 1200 may be embodied with a first vector magnitude computation unit 1261, a first delay line 1262, a second delay line 1263, a plurality Q (e.g., Q=8) of identical hardware BPCs 1201, 1202, 1203, and a shared output adder circuit 1275 connected as shown. In each BPC (e.g., 1201), there is connected a multi-stage multiply and accumulate hardware or firmware structure including a pair of K-input multiplexers 1264, 1265, a first stage multiplier 1266 and multiplexer 1267. The N-line LUT 1268 receives the output from the multiplexer 1267 and each N-line LUT receives respectively different lines (e.g. M-lines) of interpolation from a DPD adaptation processor 1288.

In various example embodiments, DPD adaptation processor 1288 may support one or more of several interpolation methods, for example, Linear, Hermite polynomial. Spline, etc. Each interpolation method requires different extrapolation data in order to update the respective N-line LUT 1268.

In a first example, DPD adaptation processor 1288, illustrated as an error calculation block, may be configured to perform a linear iteration interpolation method. In this example, DPD adaptation processor 1288 is configured to normalize $V_{in}$ to have an abs value <1. Here, for the example where M=2, the N-line LUT 1268 may be configured to provide an output ($LUT_{out}$), such that:

$$LUT_{out}=LUT_k+\text{fract}(N^*|V_{in}|)^*(LUT_{k+1}-LUT_k) \quad [1]$$

Where: k=floor ($N^*|V_{in}|$), and

In this example, two entries, namely $LUT_k$ and $LUT_{k+1}$, are used in in each BPC 1201, 1202, 1203 in order to find the interpolated value $LUT_{out}$. In some examples, different m values may be used for different BPCs 1201, 1202, 1203. Thus, in this manner the linear iteration may be clarified as:

$$LUT_k(n+1)=LUT_k+(1-\text{fract}(N^*|V_{in}|))^*m(V_{out}-V_{in})/V_{out}^*LUT_{out} \quad [2]$$

and $$LUT_{k+1}(n+1)=LUT_{k+1}+\text{fract}(N^*|V_{in}|)^*m(V_{out}-V_{in})/V_{out}^*LUT_{out} \quad [3]$$

In other examples using alternative interpolation methods, for example where M>2, a spline technique such as a cubic Hermite spline may be used. In this example, each spline of the interpolator may be a third-degree polynomial specified in Hermite form, that is by its values and first derivatives at the end points of the corresponding interval. Such known interpolation methods may be used as the interpolation error may be made small even when using low degree polynomials for the spline.

Example embodiments therefore allow construction of complex dynamic non-linear mathematical approximations using tabulated functions organized in generic scalable structure. In this manner, direct adaptation of multi-LUT based BPCs with interpolation reduces the complexity and improves overall DPI) performance.

Referring back to FIG. 12, the first stage further includes a second stage multiplier 1271 and multiplexer 1272 with an absolute value K+1 input multiplexer 1269, and a third stage multiplier 1273 and multiplexer 1274 with a complex absolute value K-input multiplexer 1270. The predistorter module 1200 also includes additional circuitry and connection ports for conveying inputs or outputs to or from other BPC units 1201, 1202, 1203. The additional circuitry includes a K-input multiplexer 1260, which receives and selects between a first input complex sample 1280 ($\underline{x}[n]$) and a second complex sample 1281 ($\underline{x}_{in}[n]$) for output to the first vector magnitude computation unit 1261 and second delay line 1263. In accordance with examples embodiments, the K-input multiplexer 1260, also outputs either the selected first input complex sample 1280 ($\underline{x}[n]$) or second complex sample 1281 ($\underline{x}_{in}[n]$) to a transmit complex samples delay line, comprising buffer and delay module 1292 and transmit filter 1293, to be used to calculate any DPD error.

In addition, the absolute value K+1 input multiplexer 1269 is provided with an input port 1282 for receiving an input term $C_{in}[n]$, such a second stage (STAGE 2) output from another BPC unit. In addition, a second stage output connection line or port 1282 may be provided at the output of the second stage multiplexer 1272 for providing an output term $C_{out}[n]$ for possible input to another BPC unit. The second delay line 1263 may also include an output connection line or port 1283 for providing an output term $x_{out}[n]$ =x[n−K−1] for possible input to another BPC unit. Likewise, the shared output adder circuit 1275 may be implemented as a Q+1 input adder which includes an input connection line or port 1284 for receiving an, input term $y_{in}[n]$, such as an output term from another BPC unit.

From the first delay line 1262, first and second absolute sample values (e.g., $A_1[n]$, $A_2[n]$) provided by the K-input multiplexers 1264, 1265 are processed at the first stage (STAGE 1) multiplier circuit 1266 and multiplexer 1267 to generate index inputs to the interpolation LUT 1268. At the second stage (STAGE 2), the second stage multiplier circuit 1271 multiplies the output from the LUT 1268 and the input provided by the K+1 input multiplexer 1269 which chooses between the absolute sample value input A[n] and the input term $C_{in}[n]$ received at the input port 1282.

The resulting product output from the second stage multiplier circuit 1271 and a bypass output from the LUT 1268 are connected to the second stage multiplexer 1272 which generates an output, term $C_{out}[n]$ at the second stage output connection line or port 1282. This same output term $C_{out}[n]$ is multiplied at the third stage (STAGE 3) multiplier circuit 1273 with a complex sample value obtained from the complex absolute value K-input multiplexer 1270. The output from the third stage multiplier circuit 1273 is connected as an input to the third, stage (STAGE 3) multiplexer 1274 which also receives the empty term or "0" input. As a result, the third stage multiplexer 1274 chooses between the empty term and the complex multiplication output from the third stage multiplier circuit 1273 for output as a first output term (e.g., $y_{B1}$) from the BPC (e.g., BPC 1201). In this way, different output terms (e.g., $y_{B1}, Y_{B2}, \ldots y_{BQ}$) from different BPCs Is (e.g., 1201-1203) may be combined or added at the shared adder circuit 1275 which also receives the input term $y_{in}[n]$ from the input connection line or port 1284. The resulting output from the shared adder circuit 1275 is the DPD output (e.g., $y[n]=y_{in}[n]+y_{B1}+y_{B2}, + \ldots y_{BQ}$).

In this manner, by cascading two BPC units using the additional input/output ports $x_{in}[n], C_{in}[n], C_{out}[n], x_{out}[n], y_{in}[n]$, higher order Volterra terms may be evaluated in accordance with selected embodiments of the present disclosure.

Referring back to FIG. 5, it is known that LUT 368 on each BPC 300 may be configured to receive a decay factor from the DPD adaptation algorithm whereby each decay factor is identical across the set of BPCs. However, as illustrated in FIG. 12, some examples of the invention provide for each decay factor being different across the set of BPCs.

In some examples, a specific decay factor (sometimes referred to as "μ factor") per LUT may be used in a scenario where each BPC has a single LUT. However, in some examples, different adaptation weight-factors per BPC may be employed, leading to a different μ factor per BPC being used In this manner, an ability to apply different adaptation rates per BPC may provide better stability, as the different Weight-factors illustrated in FIG. 12 provide an ability to choose between a faster adaptation rate (high value) vs better stability (small value). Each BPC 1201, 1202, 1203 thus provides a different influence on the total DPD actuator, and therefore different factors per BPC are chosen according to their respective influence.

In accordance with some examples, the K-input multiplexer 1260, which receives and selects between a first input complex sample 1280 (x[n]) and a second complex sample 1281 ($x_{in}[n]$), also outputs the selected complex samples to buffer and delay block 1292, which buffers and delays the selected complex samples. The buffered and delayed selected complex samples are input into a transmit filter 1293 that facilitates filtering of the samples to a particular passband(s) for DPD adaptation in DPD adaptation processor 1288. In some examples, DPD adaptation processor 1288 may employ, say, L-lines of extrapolation. In some examples, in addition to applying the filtered complex samples direct to the DPD adaptation processor 1288, the filtered complex samples are also input to error calculation block 1294. Error calculation block 1294 may be configured to determine a predistortion error, namely an error in the predistortion coefficients that are being applied to the input signal based on an analysis of a representation of the PA output signal as routed back to the error calculation block 1294. The output from the error calculation block 1294 is also input to DPD adaptation processor 1288.

In some examples, DPD adaptation processor 1288 may update 'L' entries in the LUTi, an algorithm (such as an LMS algorithm) as follows:

$$\Delta \text{LUT}i = \mu i \times A(n-ki)e'(n) \qquad [4]$$

where e' is the conjugate of the error e(n); and
e(n)=signal, after receive filter−signal after transmit filter.

In scenarios whereby the communication unit may support multiple signal bandwidths, the transmit signal bandwidth may be intermittently or regularly changed. In such a situation, the transmit filter may be changed and thus, the transmit filter 1293 in the adaptation path may also be changed. In some examples, manipulation of the adaptation passband(s) by the transmit filter 1293 pros-ides stability and performance improvements.

In accordance with some examples, output samples srx[n] from the PA are fed back to the error calculation block 1294 via a receive filter 1295. Adding receive filter 1295 in some examples may enable DPD adaptation processor 1288 to compensate for the observed linearity distortion associated with the transmit chain and receive hardware as w well as select a particular passband(s) for DPD adaptation in the same manner as the transmit filter 1293.

The predistortion error calculation performed by error calculation block 1294 is based on the selected samples in the delay line. In some examples, the same samples are used for the receive filter 1295 are used for the transmit filter 1293. DPD adaptation processor 1288 provides adaptation values to each respective LUT 1268 in order to adapt L lines of transmit signals. In some examples, L-lines of extrapolation may be employed by the DPD adaptation processor 1288. In an example where L=2, the LUT values may be clarified as:

$$\text{LUT}_k(n+1) - \text{LUT}_k + (1-\text{fract}(N^*|V_{in}|)^* \mu(srx[n]-x[n]/srx[n]^*\text{LUT}_{out} \qquad [5]$$

Figure 13:
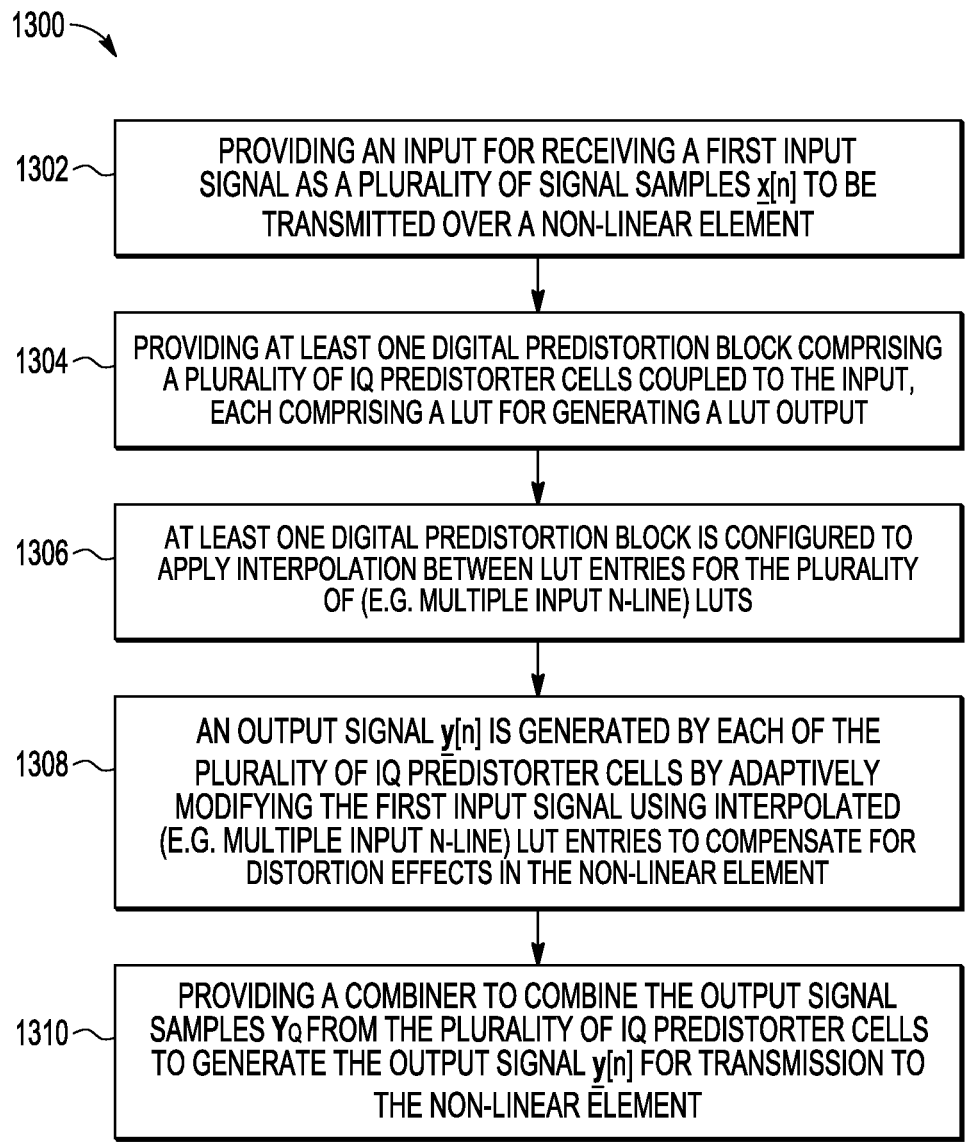
FIG. 13 illustrates a simplified flowchart for a design of one actuator arrangement of a digital predistorter hardware cell from multiple parallel digital predistorter hardware cells in accordance with selected embodiments of the present disclosure.

FIG. 13 illustrates a simplified flowchart 1300 for a design of one actuator arrangement of a digital predistorter hardware cell from multiple parallel digital predistorter hardware cells in accordance with selected embodiments of the present disclosure. The flowchart 1300 illustrates one example design of one actuator arrangement for predistorting an input signal to compensate for non-linearities caused to the input signal in producing an output signal. The flowchart 1300 includes, in 1302, providing an input to the digital predistorter hardware cell for receiving a first input signal as a plurality of signal samples x[n] to be transmitted over anon-linear element. In 1304, the example design provides at least one digital predistortion block comprising a plurality of IQ predistorter cells coupled to the input, each IQ predistorter cell comprising a lookup table (LUT) for generating an LUT output. In 1306, the at least one digital predistortion block is configured to apply interpolation between LUT entries for the plurality of LUTs is applied, for example using multiple input N-line LUTs. In 1308, the at least one digital predistortion block is configured to generate an output signal y[n] from each of the plurality of IQ predistorter cells by adaptively modifying the first input signal using interpolated LUT entries, for example to compensate for distortion effects in the non-linear element. In 1310, the example design provides a combiner configured to combine the output signal samples $y_Q$ from the plurality of IQ predistorter cells to a combiner to generate the output signal y[n] for transmission to the non-linear element.

In accordance with selected embodiments, the herein described concepts support both direct and indirect adaptation schemes. For example, instead of adapting the LUT directly a model based on the LUT may be updated and the actual LUT may be updated every defined period by copying the model LUTs. In this manner, building a model based on LUT in an indirect adaptation scheme is much less complex than creating a Volterra model. Thus, in one indirect scheme example, DPD adaptation processor 1288 may be supplemented or replaced, by a DPD model block where the DPD model data is adapted based on the calculated predistortion error from error calculation block 1294 and the model is subsequently, used to update each of the respective LUTs 1268 of the BPCs 1201, 1202, 1203. In an indirect adaptation example, am of the following adaptation methods or adaptive filters may be employed to provide data to the DPD model (not shown): e.g. least mean square (LMS), recursive least squares (RLS), QR, cross-correlation. In such solutions the LUT stores data for root finding (for example using either a linear update, secant methodology) and may use one or more of the following root finding algorithms: LMS, NLMS, Low complexity normalized LMS.

Thus, some example embodiments provide for multi-BPC structure, namely a DPD architecture using multiple BPCs that may be used to minimize memory effects or problems with the DPD operation. Some example embodiments may operate with cross-term (CT) capabilities, for example the absolute value and the complex value used for multiplication (in stage 3 of FIG. 12) and thus may use a different delay value k. In this manner, the use of CT may provide better flexibility and reduce the required number of BPCs. Some example embodiments may also support cascading, whereby the multi-BPC structure output may be used as input to other multi-BPC structures.

As disclosed herein, the system, apparatus, and methodology for evaluating a polynomial with a flexible high performance digital predistortion hardware provides a flexible hardware approach for performing pre-correction processing by cascading DPD actuators to compute Volterra series memory polynomial terms and cross terms of type 1, 2 and 3 based on look-up table (LUT) implementation in single memory. By adding the computed Volterra terms, higher performance can be achieved with the same power amplifier hard Ware (i.e., lower adjacent channel power carrier leakage and higher output power efficiency). However, it will be appreciated that the disclosed arrangement of LUT-based basic predistorter cells connected or cascaded via enhanced input/output ports may also be used for general purpose mathematical approximation and modeling of non-linear processes, and not just evaluation of Volterra series terms. Thus, the description provided herein with reference to a digital front end circuit having DPD processing is provided as an example embodiment, and it will be appreciated that the embodiments disclosed herein relate more broadly to an adaptive high-order nonlinear function approximation using time-domain Volterra series. Thus, other complex multi-purpose non-linear function structures may be implemented to provide different types of Volterra series implementations and selectable orders of approximation, such as memory polynomials, Volterra-series terms with dynamic deviation reduction, cross-term polynomials, generalized memory polynomials, etc.). In addition, the disclosed arrangement of multiple BPC blocks enables a sealable number of channels to be supported by computing different nonlinear functions in parallel at the multiple BPC blocks, thereby increasing throughput and efficiency. The inclusion of look-up tables in each basic predistorter cell also enables real-time programmability and configuration of the nonlinear functions provided by the digital predistortion hardware so that the definition and structural operation of the hardware may be changed on demand. For example, as an application needs more complex approximation, the additional BPCs may be engaged. The BPC hardware is also suitable for high-speed and computationally intensive SoC applications. The BPC structure provides design opportunities for high frequency clocking. The design can be implemented as optimized and hardened core, which is later used in application-specific SoC realizations with customized interconnect in the upper levels of the layout hierarchy.

As will be appreciated, the disclosed mechanism, system and methodology described herein for using a digital predistortion hardware with cascaded LUT-based basic predistorter cells to efficiently evaluate complex polynomials against a complex input vector may be embodied in hardware as a plurality of multiply/multiplex stages with storage flop devices for holding intermediate computation results for different complex input vector values. However, selected aspects of the digital predistortion hardware functionality may be programmed or loaded by processing circuitry (e.g., a field-programmable gate array) executing software (e.g., in a processor or a controller including but not limited to firmware, resident software, microcode, etc.). Any such programming operation may be embodied in whole or in part as a computer program product accessible from a computer-usable or computer-readable medium providing program code for use by or in connection with a computer or any instruction execution system, where a computer-usable or computer readable medium can be any apparatus that may include, store, communicate, propagate, or transport the program for use by or in connection with the instruction execution system, apparatus, or device. Examples of a computer-readable medium include a semiconductor or solid state memory, magnetic tape, a removable computer diskette, a random access memory (RAM), a read-only memory (ROM), a rigid magnetic disk, USB memory stick, and an optical disk, such as a compact disk-read only memory (CD-ROM), compact disk-read/write (CD-RAW), DVD, and the like.

In some examples, the DPD concepts herein described may be embodied in one or more integrated circuits. In some examples, an improved performance with lower die area and lower power consumption may be achieved with the one or more integrated circuits due to the flexible and multi-faceted approach to achieving predistortion. In some examples, the DPD concepts herein described may be agnostic to various radio access technologies (RATs) and thus may be embodied in one or more of the following: Long Term Evolved (LTE™) products, Wideband Code Division Multiple Access (WCDMA) products, Global System for Mobile communications (GSM) products, EDGE, eta In some examples, the DPD concepts herein described may be scalable across various base-station types, e.g. pico-cell, femto-cell to macro-cell base-stations.

By now it should be appreciated that there has been provided a method, integrated circuit and an electronic device such as a wireless communication unit for predistorting an input signal to compensate for non-linearities of the electronic device that operates on the input signal to produce an output signal, such as may be used by performing digital pre-distortion in a base station having a radio frequency (RF) communication signal path and transceiver front end.

In the disclosed methodology for predistorting an input signal to compensate for non-linearities caused to the input signal in producing an output signal, there is provided an input for receiving a first input signal as a plurality of signal samples $\underline{x}[n]$ to be transmitted over a non-linear element, providing at least one digital predistortion block comprising, a plurality of IQ predistorter cells coupled to the input, each IQ predistorter cell comprising a lookup table (LUT) for generating an LUT output; wherein the at least one digital predistortion block is configured to apply interpolation between LUT entries for the plurality of LUTs and generate an output signal $\underline{y}[n]$ by each of the plurality of IQ predistorter cells by adaptively modifying the first input signal using interpolated LUT entries; and providing a combiner to combine the output signal samples $y_Q$ from the plurality of IQ predistorter cells into a combined signal to generate the output signal $\underline{y}[n]$ for transmission to the non-linear element.

In selected embodiments, the at least one digital predistortion block being configured to apply interpolation between LUT entries for the plurality of LUTs and generating an output signal $\underline{y}[n]$ by each of the plurality of IQ predistorter cells by adaptively modifying the first input signal using interpolated LUT entries may include the at least one digital predistortion block being configured to apply interpolation between LUT entries for a plurality of multiple input N line LUTs and the at least one digital predistortion block being configured to generate an output signal $\underline{y}[n]$ by each of the plurality of IQ predistorter cells by adaptively modifying the first input signal using interpolated multiple input N line LUT entries.

In addition, the at least one digital predistortion block being configured to apply interpolation between LUT entries for the plurality of LUTs may include the at least one digital predistortion block being configured to apply multiple M lines of interpolation between LUT entries for the plurality of LUTs.

In example, embodiments, a digital predistortion adaptation block may be coupled to the at least one digital predistortion block and configured to apply adaptation values to each of the plurality of LUTs based on a predistortion performance of the at least one digital predistortion block.

In example embodiments, at least one error generation path may include an error calculation block coupled to the digital predistortion adaptation block and be configured to apply predistortion error values to the digital predistortion adaptation block. The digital predistortion adaptation block may be configured to apply adaptation values to a plurality of LUT entries per IQ predistorter cell using a plurality of lines L of extrapolation from the error calculation block. The digital predistortion adaptation block may include a linear update or secant update of values to a plurality of LUT entries per IQ predistorter cell. The at least one error generation path may include a source path including a buffered delay line configured to route a modified version of the first input signal to the digital predistortion adaptation block and a receive error generation path configured to provide observation data on the predistortion performance of the at least one digital predistortion block to the receive error calculation block to support timing alignment of the adaptively modified first input signal and observation data thereof. One or more filters may be provided in the at least one error generation path prior to the error calculation block. The one or more filters may be inserted in the source path both before and after the buffered delay line.

In example embodiments, providing at least one digital predistortion block configured to apply interpolation between LUT entries for the plurality of LUTs may include providing at least one digital predistortion block configured to apply a different decay $\mu$ factor per digital predistortion block.

In example embodiments, a first digital predistortion block may be configured to generate one or more static Volterra polynomial terms, a second digital predistortion block may be configured to generate one or more dynamic Volterra memory polynomial terms, a third digital predistortion block may be configured to generate one or more type 1. Volterra cross-terms, and one or more fourth digital predistortion blocks may be configured to generate one or more type 2 or type 3 Volterra cross-terms. For example, the fourth digital predistortion blocks may be provided as a plurality of cascaded digital predistortion blocks which are connected together and configured to generate second order type 2 or type 3 Volterra cross-terms.

In another form, an example design of an integrated circuit for predistorting an input signal that compensates for non-linearities caused to the input signal in producing an output signal is described. The integrated circuit includes: an input for receiving a first input signal as a plurality of signal samples $\underline{x}[n]$ to be transmitted over a non-linear element; at least one digital predistortion block comprising a plurality of IQ predistorter cells coupled to the input, each comprising a lookup table (LUT) for generating an LUT output. The at least one digital predistortion block is configured to: apply interpolation between LUT entries for the plurality of LUTs; and generate an output signal $\underline{y}[n]$ by adaptively modifying the first input signal using interpolated LUT entries to compensate for distortion effects in the non-linear element.

In some examples the integrated circuit may include, or be configured to be countable to, a combiner coupled to the processor circuit and configured to combine the output signal samples from the plurality of IQ predistorter cells into an output signal for transmission to the non-linear element.

In yet another form, an electronic device includes a non-linear circuit and a processor circuit coupled to the non-linear circuit configured to predistort an input signal to compensate for non-linearities caused by the non-linear circuit in, producing an output signal. The processor circuit includes: an input for receiving a first input signal as a plurality of signal samples $\underline{x}[n]$ to be transmitted over a non-linear element; at least one digital predistortion block comprising: a plurality of IQ predistorter cells coupled to the input, each IQ predistorter cell comprising a lookup table (LUT) for generating an LUT output and configured to: apply interpolation between LUT entries for the plurality of LUTs; and generate an output signal $\underline{y}[n]$ from each of the plurality of IQ predistorter cells by adaptively modifying the first input signal using interpolated LUT entries to compensate for distortion effects in the non-linear element. The electronic device further includes a combiner coupled to the processor circuit and configured to, combine the output signal samples $y_Q$ from each of the plurality of IQ predistorter cells into an output signal $\underline{y}[n]$ for transmission to the non-linear element.

Although the described exemplary embodiments disclosed herein are directed to hardware-based methods and systems for efficiently evaluating higher order Volterra series terms, the present invention is not necessarily limited to the example embodiments illustrate herein, and various embodiments of the circuitry and methods disclosed herein may be implemented with other devices and circuit components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth but on the contrary, is intended to cover such alternatives, modifications and equivalents as may be included within the spirit and scope of the invention as defined by the appended claims so that those skilled in the art should understand that they can make various changes substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort, might be complex and time-consuming, it would nevertheless be a routine undertaking for those of ordinary skill in the art having the benefit of this disclosure. For example, selected aspects are shown in block diagram rosin, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art. Various illustrative embodiments of the present invention will now be described in detail below with reference to the figures.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising" or any other variation thereof, are intended to cover a non-exclusive inclusion, such that a process, method, article, or apparatus that comprises a list of elements does not include only those elements but may include other elements not expressly listed or inherent to such process, method, article, or apparatus.

Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Also, the use of phrases such as 'or' within the description can be interpreted either exclusively or inclusively, depending upon which is broader in terms of the context described. Unless stated otherwise, terms such as 'first' and 'second' are used to arbitrarily distinguish between the elements such terms describe. Thus these terms are not necessarily intended to indicate temporal or other prioritization of such elements. The mere fact that certain measures are recited in mutually different claims does not indicate that a combination of these measures cannot be used to advantage.

We claim:

1. A method for predistorting an input signal to compensate for non-linearities caused to the input signal in producing an output signal, the method comprising:

providing an input for receiving a first input signal as a plurality of signal samples, to be transmitted over a non-linear element;

providing at least one digital predistortion block comprising a plurality of IQ predistorter cells coupled to the input, each IQ predistorter cell comprising a lookup table (LUT) for generating an LUT output to form a plurality of LUTs, wherein the at least one digital predistortion block is configured to apply interpolation between LUT entries for the plurality of LUTs and generate an output signal from each of the plurality of IQ predistorter cells by adaptively modifying the first input signal using interpolated LUT entries;

providing a combiner to combine the output signal from the plurality of IQ predistorter cells to generate the output signal for transmission to the non-linear element;

providing a digital predistortion adaptation block coupled to the at least one digital predistortion block and configured to apply adaptation values to each of the plurality of LUTs based on a predistortion performance of the at least one digital predistortion block; and providing at least one error calculation block coupled to the digital predistortion adaptation block and configured to apply predistortion error values to the digital predistortion adaptation block, wherein providing at least one error calculation block configured to apply adaptation values to the digital predistortion adaptation block comprises providing at least one error calculation block configured to apply adaptation values to the plurality of LUT entries per IQ predistorter cell using a plurality of lines of extrapolation.

2. The method of claim 1, wherein:

providing at least one digital predistortion block configured to apply interpolation between LUT entries for the plurality of LUTs comprises providing at least one digital predistortion block configured to apply interpolation between LUT entries for a plurality of multiple input line LUTs, and providing at least one digital predistortion block configured to generate the output signal from each of the plurality of IQ predistorter cells comprises providing at least one digital predistortion block configured to generate the output signal from each of the plurality of IQ predistorter cells by adaptively modifying the first input signal using interpolated multiple input N line LUT entries.

3. The method of claim 1, wherein providing at least one digital predistortion block configured to apply interpolation between LUT entries for the plurality of LUTs comprises providing at least one digital predistortion block configured to apply multiple lines of interpolation between LUT entries for the plurality of LUTs.

4. The method of claim 1, wherein providing at least one error calculation block configured to apply adaptation values to the digital predistortion adaptation block comprises providing at least one error calculation block configured to apply a linear update or secant update of adaptation values to the plurality of LUT entries per IQ predistorter cell.

5. The method of claim 1, wherein providing at least one error calculation block comprises:
providing a source path including a buffered delay line configured to route a modified version of the first input signal to the digital predistortion adaptation block; and
providing a receive error generation path configured to provide observation data on the predistortion performance of the at least one digital predistortion block to the error calculation block to support timing alignment of the adaptively modified first input signal and observation data thereof.

6. The method of claim 5 further comprising providing at least one filter in the receive error generation path.

7. The method of claim 5 further comprising providing at least one filter in the source path both before and after the buffered delay line.

8. The method of claim 1, wherein providing at least one digital predistortion block configured to apply interpolation between LUT entries for the plurality of LUTs includes providing at least one digital predistortion block configured to apply a different decay factor per digital predistortion block.

9. The method of claim 1, wherein providing at least one digital predistortion block comprises:
providing a first digital predistortion block configured to generate at least one static Volterra polynomial term;
providing a second digital predistortion block configured to generate at east one dynamic Volterra memory polynomial term;
providing a third digital predistortion block configured to generate at least one type-1 Volterra cross-term; and
providing at least one fourth digital predistortion block configured to generate at least one type-2 or type-3 Volterra cross-term.

10. The method of claim 9, wherein providing at least one fourth digital predistortion block comprises providing a plurality of cascaded digital predistortion blocks that are connected together and configured to generate second order type-2 or type-3 Volterra cross-terms.

11. The method of claim 1, wherein providing the input comprises providing a multiplexer for selecting between the first input signal and a second input signal of a plurality of delayed signal samples.

12. The method of claim 1, further comprising providing a memory coupled to the at least one digital predistortion block and configured to store a result from applying interpolation between LUT entries for the plurality of LUTs for use by an indirect digital predistortion model.

13. An integrated circuit for predistorting an input signal to compensate for non-linearities caused to the input signal in producing an output signal, the integrated circuit comprising:
an input for receiving a first input signal as a plurality of signal samples to be transmitted over a non-linear element;
at least one digital predistortion block comprising a plurality of IQ predistorter cells coupled to the input, each IQ predistorter cell comprising a lookup table (LUT) for generating an LUT output to form a plurality of LUTs, and configured to:
apply interpolation between LUT entries for the plurality of LUTs, and
generate an output signal from each of the plurality of IQ predistorter cells by adaptively modifying the first input signal using interpolated LUT entries;
a digital predistortion adaptation block coupled to the at least one digital predistortion block and configured to apply adaptation values to each of the plurality of LUTs based on a predistortion performance of the at least one digital predistortion block; and
at least one error calculation block coupled to the digital predistortion adaptation block and configured to apply predistortion error values to the digital predistortion adaptation block, wherein the at least one error calculation block is configured to apply adaptation values to the plurality of LUT entries per IQ predistorter cell using a plurality of lines of extrapolation.

14. The integrated circuit of claim 13, wherein the at least one digital predistortion block is configured to apply interpolation between LUT entries for a plurality of multiple input line LUTs and generate an output signal from each of the plurality of IQ predistorter cells by adaptively modifying the first input signal using interpolated multiple input line LUT entries.

15. The integrated circuit of claim 13, wherein the at least one digital predistortion block is configured to apply multiple lines of interpolation between LUT entries for the plurality of LUTs.

16. The integrated circuit of claim 13, wherein the digital predistortion adaptation block is coupled to the plurality of IQ predistorter cells.

17. An electronic device comprising:
a non-linear circuit;
a processor circuit, coupled to the non-linear circuit, configured to predistort an input signal to compensate for non-linearities caused to the input signal in producing an output signal, wherein the processor circuit comprises:
an input for receiving a first input signal as a plurality of signal samples to be transmitted over a non-linear element;
at least one digital predistortion block comprising a plurality of IQ predistorter cells coupled to the input, each IQ predistorter cell comprising a lookup table (LUT) for generating an LUT output to form a plurality of LUTs and configured to:
apply interpolation between LUT entries for the plurality of LUTs;
generate an output signal from each of the plurality of IQ predistorter cells by adaptively modifying the first input signal using interpolated LUT entries;
a digital predistortion adaptation block coupled to the at least one digital predistortion block and configured to apply adaptation values to each of the plurality of LUTs based on a predistortion performance of the at least one digital predistortion block;
at least one error calculation block coupled to the digital predistortion adaptation block and configured to apply predistortion error values to the digital predistortion adaptation block, wherein the at least one error calculation block is configured to apply adaptation values to the plurality of LUT entries per IQ predistorter cell using a plurality of lines of extrapolation; and a combiner coupled to the processor circuit and configured to combine the output signal from each of the plurality of IQ predistorter cells into an output signal for transmission to the non-linear element.

18. A method for predistorting an input signal to compensate for non-linearities caused to the input signal in producing an output signal, the method comprising:
providing an input for receiving a first input signal as a plurality of signal samples, to be transmitted over a non-linear element;
providing at least one digital predistortion block comprising a plurality of IQ predistorter cells coupled to the input, each IQ predistorter cell comprising a lookup table (LUT) for generating an LUT output to form a plurality of LUTs, wherein the at least one digital predistortion block is configured to apply interpolation between LUT entries for the plurality of LUTs and generate an output signal from each of the plurality of IQ predistorter cells by adaptively modifying the first input signal using interpolated LUT entries;
providing a combiner to combine the output signal from the plurality of IQ predistorter cells to generate the output signal for transmission to the non-linear element;
providing a digital predistortion adaptation block coupled to the at least one digital predistortion block and configured to apply adaptation values to each of the plurality of LUTs based on a predistortion performance of the at least one digital predistortion block; and
providing at least one error calculation block coupled to the digital predistortion adaptation block and configured to apply predistortion error values to the digital predistortion adaptation block, wherein providing at least one error calculation block comprises:
providing a source path including a buffered delay line configured to route a modified version of the first input signal to the digital predistortion adaptation block; and
providing a receive error generation path configured to provide observation data on the predistortion performance of the at least one digital predistortion block to the error calculation block to support timing alignment of the adaptively modified first input signal and observation data thereof.

19. A method for predistorting an input signal to compensate for non-linearities caused to the input signal in producing an output signal, the method comprising:
providing an input for receiving a first input signal as a plurality of signal samples, to be transmitted over a non-linear element;
providing at least one digital predistortion block comprising a plurality of IQ predistorter cells coupled to the input, each IQ predistorter cell comprising a lookup table (LUT) for generating an LUT output to form a plurality of LUTs, wherein the at least one digital predistortion block is configured to apply interpolation between LUT entries for the plurality of LUTs and generate an output signal from each of the plurality of IQ predistorter cells by adaptively modifying the first input signal using interpolated LUT entries, wherein providing at least one digital predistortion block comprises:
providing a first digital predistortion block configured to generate at least one static Volterra polynomial term,
providing a second digital predistortion block configured to generate at east one dynamic Volterra memory polynomial term,
providing a third digital predistortion block configured to generate at least one type-1 Volterra cross-term, and
providing at least one fourth digital predistortion block configured to generate at least one type-2 or type-3 Volterra cross-term; and
providing a combiner to combine the output signal from the plurality of IQ predistorter cells to generate the output signal for transmission to the non-linear element.

* * * * *